US012575156B2

(12) United States Patent
Chang et al.

(10) Patent No.: US 12,575,156 B2
(45) Date of Patent: *Mar. 10, 2026

(54) REDUCING PATTERN LOADING IN THE ETCH-BACK OF METAL GATE

(71) Applicant: Taiwan Semiconductor Manufacturing Co., Ltd., Hsinchu (TW)

(72) Inventors: Po-Chin Chang, Taichung City (TW); Wei-Hao Wu, Hsinchu (TW); Li-Te Lin, Hsinchu (TW); Pinyen Lin, Rochester, NY (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/731,945

(22) Filed: Jun. 3, 2024

(65) Prior Publication Data

US 2024/0322010 A1     Sep. 26, 2024

Related U.S. Application Data

(60) Continuation of application No. 18/298,095, filed on Apr. 10, 2023, now Pat. No. 12,034,059, which is a
(Continued)

(51) Int. Cl.
*H10D 64/01* (2025.01)
*H10D 30/01* (2025.01)
(Continued)

(52) U.S. Cl.
CPC ......... *H10D 64/017* (2025.01); *H10D 30/024* (2025.01); *H10D 30/62* (2025.01);
(Continued)

(58) Field of Classification Search
CPC ........... H01L 29/66545; H01L 29/4966; H01L 29/6656; H01L 29/66795; H01L 29/785;
(Continued)

(56) References Cited

U.S. PATENT DOCUMENTS

| | | | |
|---|---|---|---|
| 8,252,675 B2 | 8/2012 | Lee et al. | |
| 8,507,979 B1 | 8/2013 | Huang et al. | |

(Continued)

FOREIGN PATENT DOCUMENTS

| | | |
|---|---|---|
| CN | 107452787 A | 12/2017 |
| KR | 20110064477 A | 6/2011 |

(Continued)

*Primary Examiner* — Jose R Diaz
(74) *Attorney, Agent, or Firm* — Slater Matsil, LLP

(57) ABSTRACT
A method includes removing a dummy gate to leave a trench between gate spacers, forming a gate dielectric extending into the trench, depositing a metal layer over the gate dielectric, with the metal layer including a portion extending into the trench, depositing a filling region into the trench, with the metal layer have a first and a second vertical portion on opposite sides of the filling region, etching back the metal layer, with the filling region at least recessed less than the metal layer, and remaining parts of the portion of the metal layer forming a gate electrode, depositing a dielectric material into the trench, and performing a planarization to remove excess portions of the dielectric material. A portion of the dielectric material in the trench forms at least a portion of a dielectric hard mask over the gate electrode.

20 Claims, 29 Drawing Sheets

Related U.S. Application Data continuation of application No. 17/306,316, filed on May 3, 2021, now Pat. No. 11,626,506, which is a division of application No. 16/035,844, filed on Jul. 16, 2018, now Pat. No. 10,998,421.

(51) Int. Cl.

| | |
|---|---|
| *H10D 30/62* | (2025.01) |
| *H10D 64/66* | (2025.01) |
| *H10D 84/01* | (2025.01) |
| *H10D 84/03* | (2025.01) |

(52) U.S. Cl.
CPC ......... *H10D 64/021* (2025.01); *H10D 64/667* (2025.01); *H10D 84/0142* (2025.01); *H10D 84/0158* (2025.01); *H10D 84/0177* (2025.01); *H10D 84/038* (2025.01)

(58) Field of Classification Search
CPC .... H01L 21/823431; H01L 21/823842; H10D 84/0179; H10D 64/017; H10D 64/021; H10D 64/513; H10D 64/517–519; H10D 64/665–667; H10D 84/0142; H10D 84/0135; H10D 84/0177; H10D 84/0158; H10D 30/62; H10D 30/024
See application file for complete search history.

(56) References Cited

U.S. PATENT DOCUMENTS

| | | | |
|---|---|---|---|
| 8,673,731 | B2 | 3/2014 | Chang et al. |
| 9,190,488 | B1 * | 11/2015 | Park ....................... H10D 64/01 |
| 9,852,947 | B1 | 12/2017 | Ko et al. |
| 10,121,675 | B2 | 11/2018 | Lee et al. |
| 10,164,111 | B2 | 12/2018 | Chang et al. |
| 10,170,427 | B2 | 1/2019 | Chang et al. |
| 10,269,646 | B2 | 4/2019 | More et al. |
| 10,475,893 | B2 | 11/2019 | Bian |
| 10,930,843 | B2 | 2/2021 | Araki |
| 10,998,421 | B2 * | 5/2021 | Chang ............... H01L 29/66545 |
| 11,626,506 | B2 | 4/2023 | Chang et al. |
| 2002/0038402 | A1 | 3/2002 | Kanaya |
| 2007/0190763 | A1 | 8/2007 | Fujimoto |
| 2012/0146130 | A1 | 6/2012 | Hirler et al. |
| 2013/0109174 | A1 | 5/2013 | Grasshoff |
| 2014/0048890 | A1 | 2/2014 | Lee et al. |
| 2014/0191300 | A1 | 7/2014 | Jhaveri et al. |
| 2015/0233864 | A1 | 8/2015 | Shen et al. |
| 2016/0163601 | A1 | 6/2016 | Xie et al. |
| 2016/0380066 | A1 | 12/2016 | Lin et al. |
| 2017/0194210 | A1 | 7/2017 | Oh et al. |
| 2017/0200798 | A1 | 7/2017 | Chen et al. |
| 2018/0166571 | A1 * | 6/2018 | Liu .................... H10D 30/0227 |

FOREIGN PATENT DOCUMENTS

| | | |
|---|---|---|
| KR | 20140016792 A | 2/2014 |
| TW | 201814832 A | 4/2018 |
| TW | 201818504 A | 5/2018 |
| TW | 201824397 A | 7/2018 |
| TW | 201824448 A | 7/2018 |
| TW | 201824492 A | 7/2018 |

* cited by examiner

500

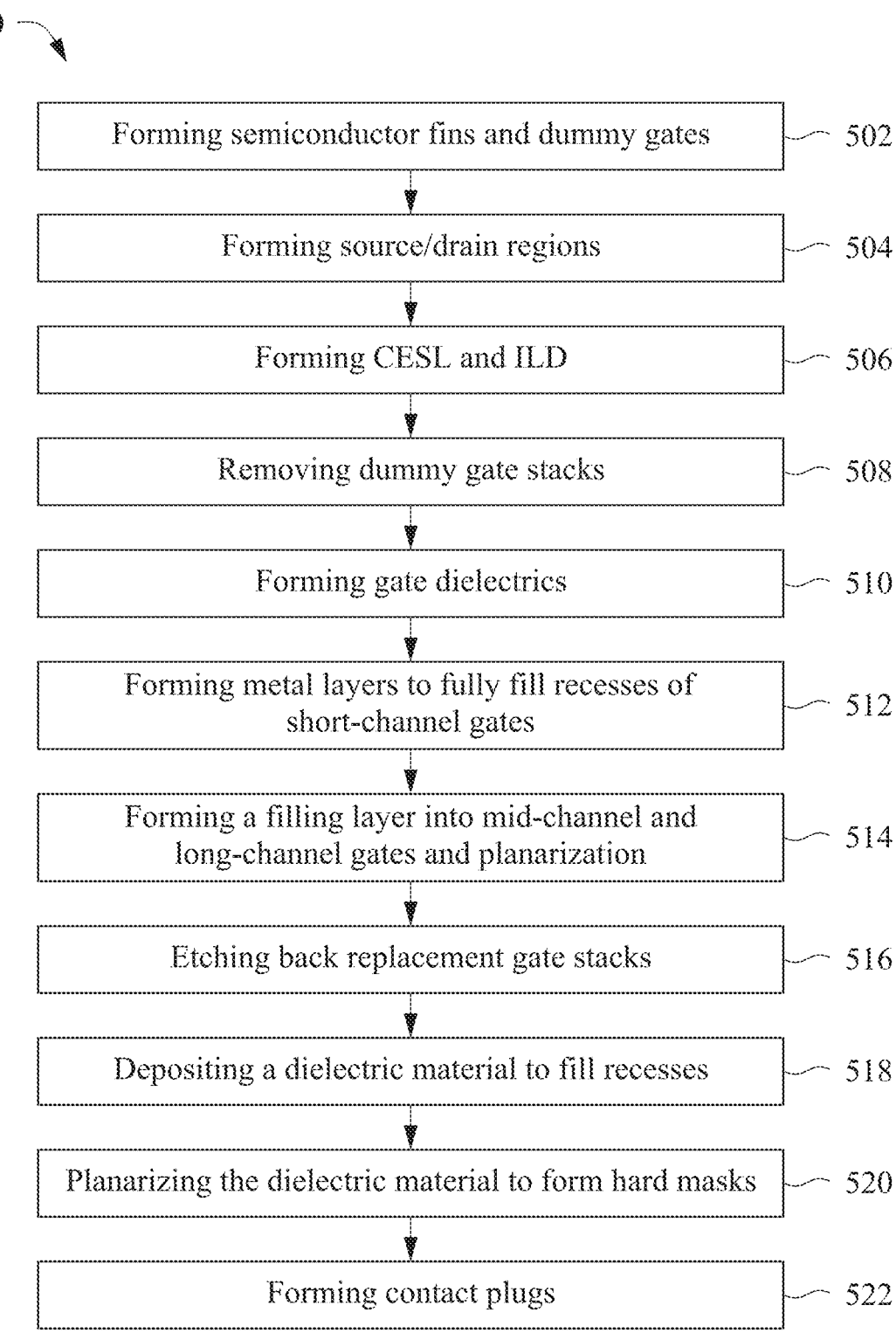

| Forming semiconductor fins and dummy gates | — 502 |

| Forming source/drain regions | — 504 |

| Forming CESL and ILD | — 506 |

| Removing dummy gate stacks | — 508 |

| Forming gate dielectrics | — 510 |

| Forming metal layers to fully fill recesses of short-channel gates | — 512 |

| Forming a filling layer into mid-channel and long-channel gates and planarization | — 514 |

| Etching back replacement gate stacks | — 516 |

| Depositing a dielectric material to fill recesses | — 518 |

| Planarizing the dielectric material to form hard masks | — 520 |

| Forming contact plugs | — 522 |

FIG. 28

REDUCING PATTERN LOADING IN THE ETCH-BACK OF METAL GATE

PRIORITY CLAIM AND CROSS-REFERENCE

This application is a continuation of U.S. patent application Ser. No. 18/298,095, entitled "Reducing Pattern Loading in the Etch-Back of Metal Gate," filed on Apr. 10, 2023, which is a continuation of U.S. patent application Ser. No. 17/306,316, entitled "Reducing Pattern Loading in the Etch-Back of Metal Gate," filed on May 3, 2021, now U.S. Pat. No. 11,626,506, issued Apr. 11, 2023, which is a divisional of U.S. patent application Ser. No. 16/035,844, entitled "Reducing Pattern Loading in the Etch-Back of Metal Gate," filed on Jul. 16, 2018, now U.S. Pat. No. 10,998,421, issued May 4, 2021, which applications are incorporated herein by reference.

BACKGROUND

In the formation of metal gates and the respective gate contact plugs for Fin Field-Effect Transistors (FinFETs), the metal gates are often recessed, and hard masks are filled into the recesses formed due to the recessing of the metal gates. Some parts of the hard masks are subsequently removed to form contact openings, through which the metal gates are exposed. The gate contact plugs are formed to connect to the metal gates.

The recessing of the hard masks results in the metal gate loss, which requires the metal gates to be formed higher than their final heights in order to compensate for the lost height. The increased height of the metal gates causes difficulty in the gap-filling for forming the metal gates. Also, the recessing of the hard masks suffers from pattern-loading effect in the etching of the hard masks, and the pattern-loading effect causes some metal gates to be recessed more than other metal gates. For example, the transistors in a wafer/die may include short-channel transistors, mid-channel transistors, and/or long-channel transistors. When the metal gates of the short-channel transistors, mid-channel transistors, and/or long-channel transistors are etched simultaneously, the pattern-loading effect may result in the metal gates of the long-channel transistors to be recessed more than that of the mid-channel transistors, and the metal gates of the mid-channel transistors to be recessed more than that of the short-channel transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 28 illustrates a process flow for forming FinFETs with different gate widths in accordance with some embodiments.

DETAILED DESCRIPTION

Figure 1:
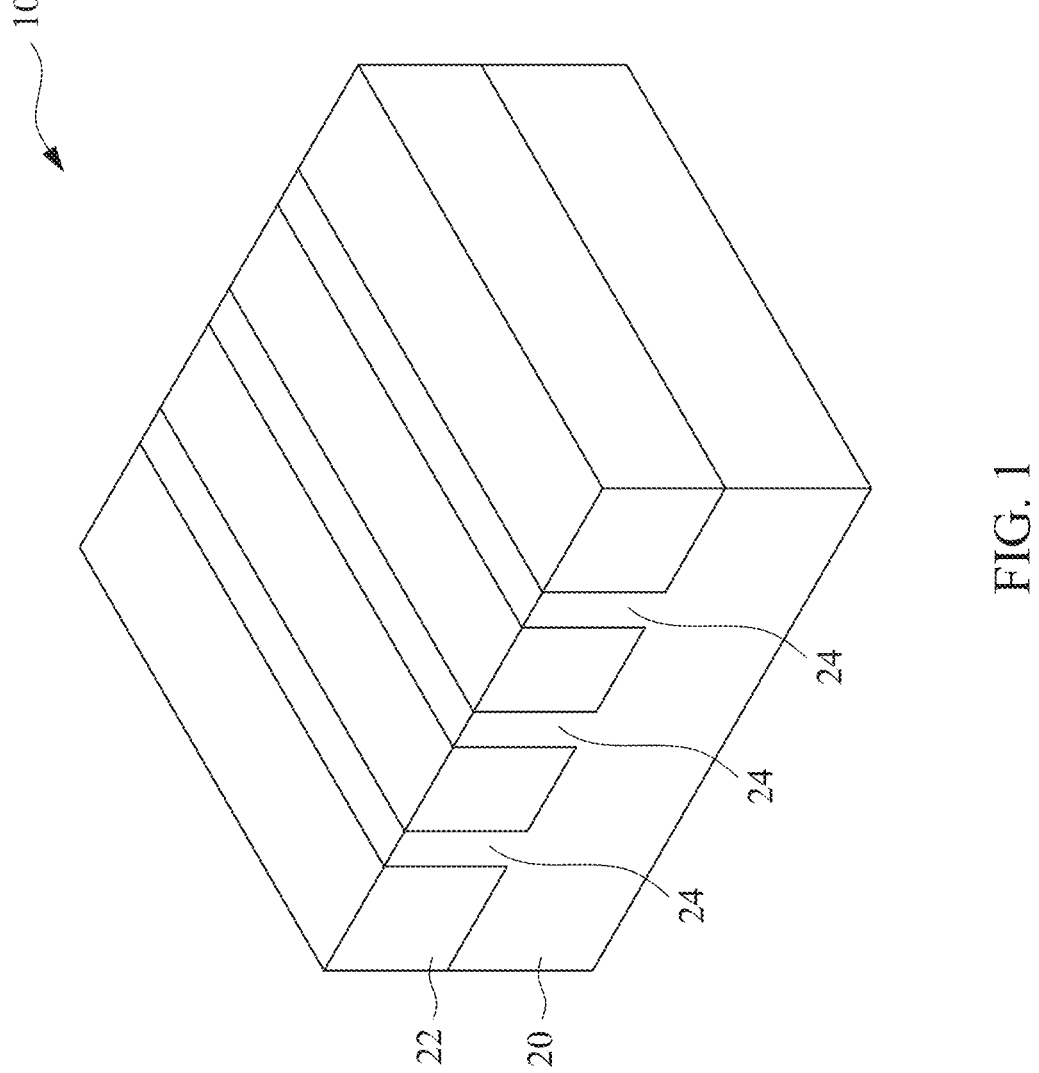
FIGS. 1-4, 5A, 5B, and 6 through 17 are perspective views and cross-sectional views of intermediate stages in the formation of Fin Field-Effect Transistors (FinFETs) with different channel lengths (gate widths) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. Planar transistors may also adopt the concept of the present disclosure.

Figure 25:
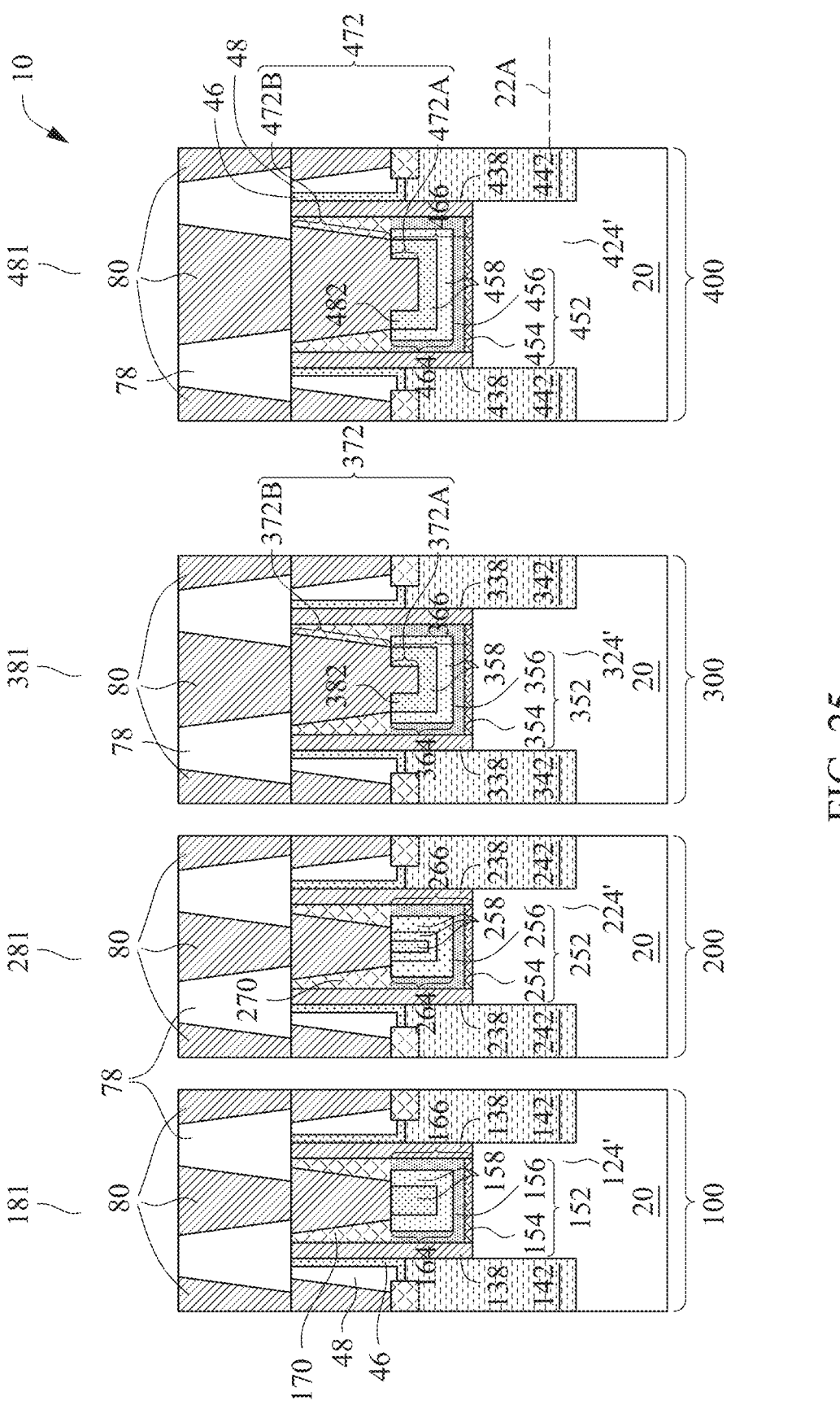

FIGS. 1 through 17 illustrate the cross-sectional views and perspective views of intermediate stages in the formation of FinFETs in accordance with some embodiments of the present disclosure. The steps shown in FIGS. 1 through 17 are also reflected schematically in the process flow 500 as shown in FIG. 25. FIGS. 1 through 6 illustrate the formation of semiconductor fins, dummy gate stacks, source and drain regions, Contact Etch Stop layer (CESL), Inter-Layer Dielectric (ILD), etc. The process shown in FIGS. 1 through 6 may be adopted by short-channel transistors, mid-channel transistors, and long-channel transistors, and the transistors may be p-type or n-type.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some exemplary embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
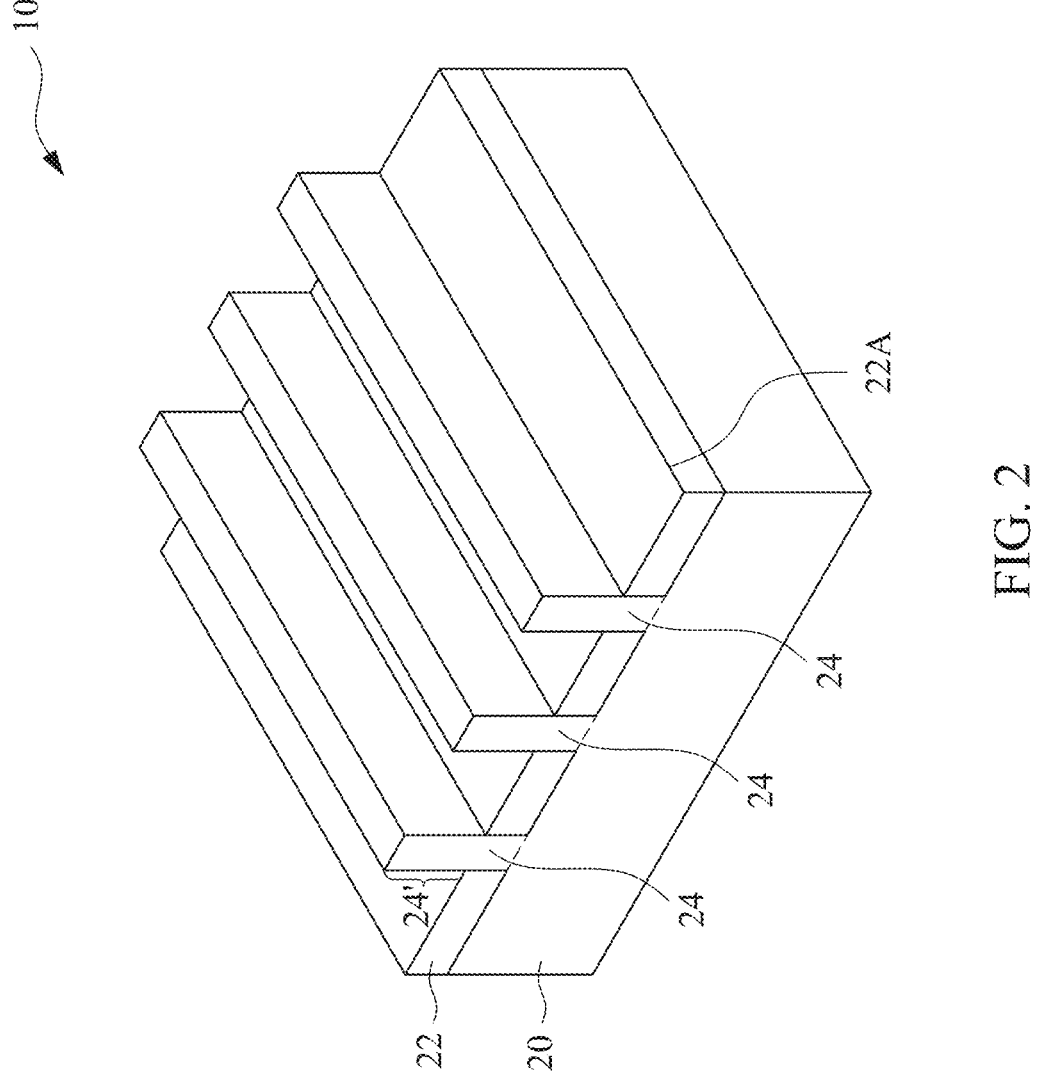

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 502 in the process flow 500 as shown in FIG. 28. The etching may be performed using a dry etching process, wherein a mixture of $NF_3$ and $NH_3$ or a mixture of HF and $NH_3$ is used as the etching gas. During the etching process, plasma may be generated. Argon may also be included. In accordance with alternative embodiments of the present disclosure, the recessing of STI regions 22 is performed using a wet etch process. The etching chemical may include HF solution, for example.

Figure 3:
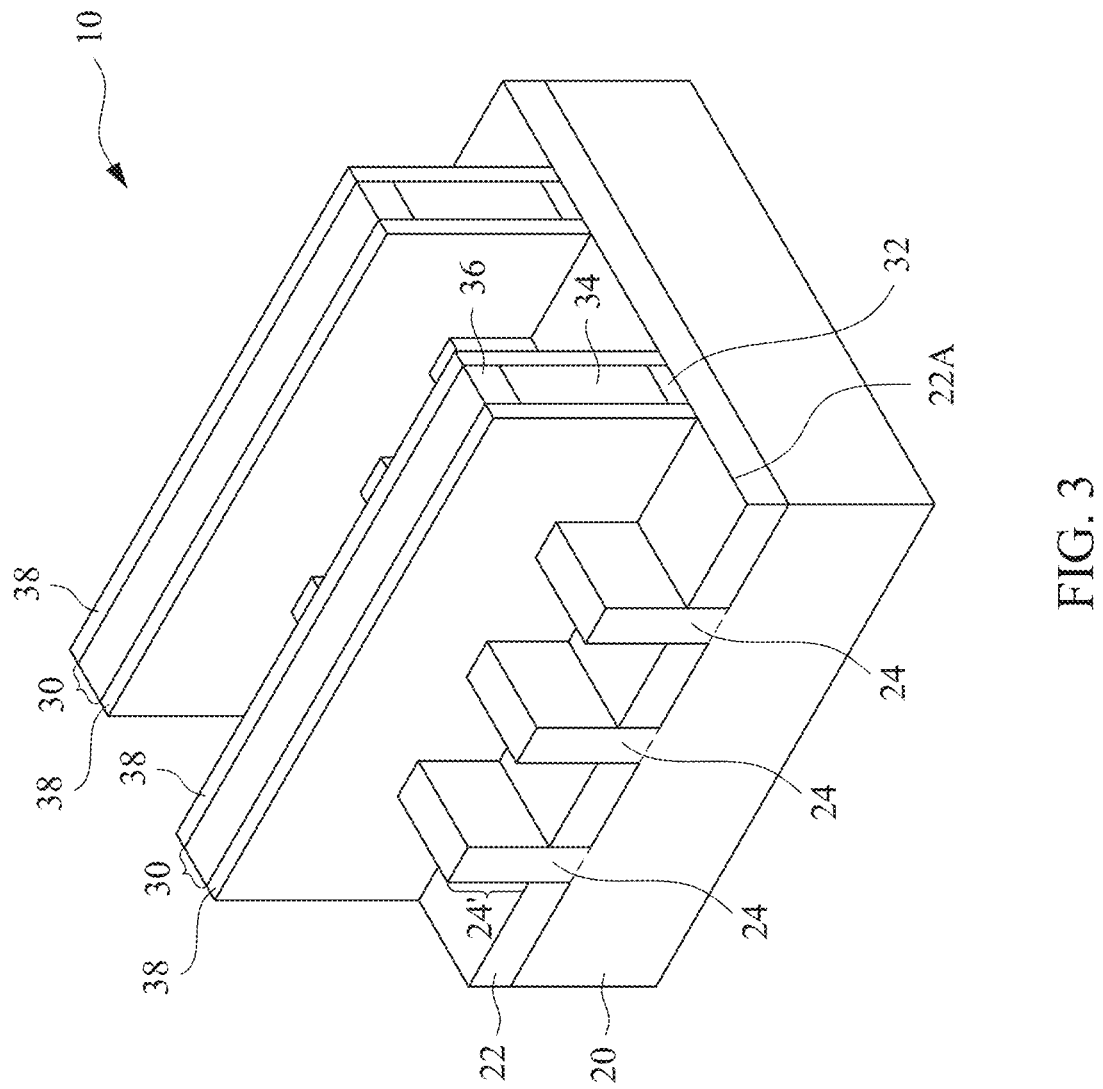

Referring to FIG. 3, dummy gate stack 30 is formed on the top surfaces and the sidewalls of (protruding) fins 24'. The respective process is also illustrated as process 502 in the process flow 500 as shown in FIG. 28. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as silicon nitride, silicon carbo-nitride, or the like, and may have a single-layer structure or a multi-layer structure including a plurality of dielectric layers. In accordance with some embodiments of the present disclosure, gate spacers 38 are formed of silicon nitride, silico oxy-carbo-nitride, or the like. The thickness of gate spacers 38 may be smaller than about 10 nm.

Figure 4:
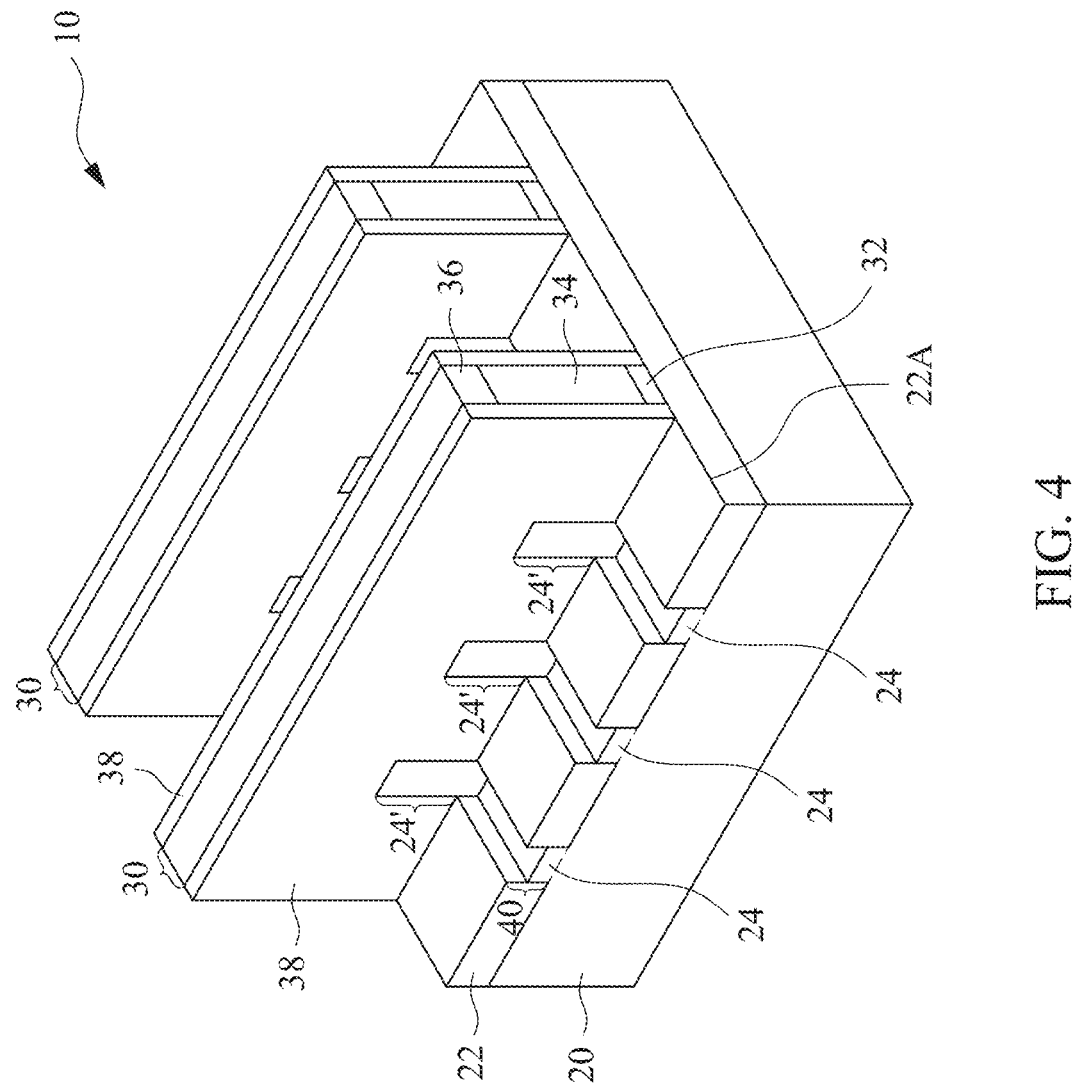

An etching step (referred to as source/drain recessing hereinafter) is then performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Figure 5A:
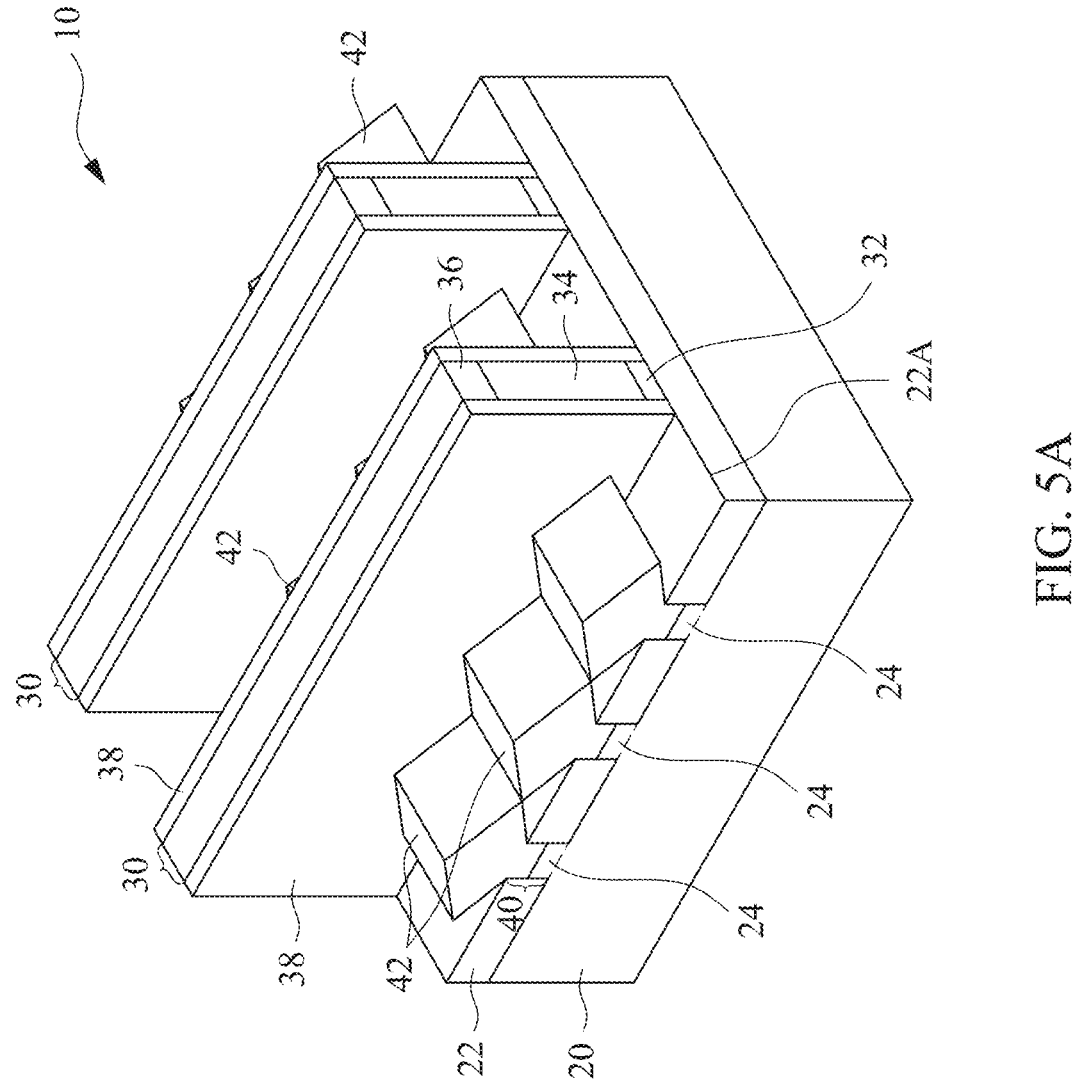

Next, epitaxy regions (source/drain regions) 42 are formed by selectively growing a semiconductor material in recesses 40, resulting in the structure in FIG. 5A. The respective process is illustrated as process 504 in the process flow 500 as shown in FIG. 28. In accordance with some exemplary embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), SiB, or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy to form source/drain regions. Epitaxy source/drain regions 42 include lower portions that are formed in STI regions 22, and upper portions that are formed over the top surfaces of STI regions 22.

Figure 5B:
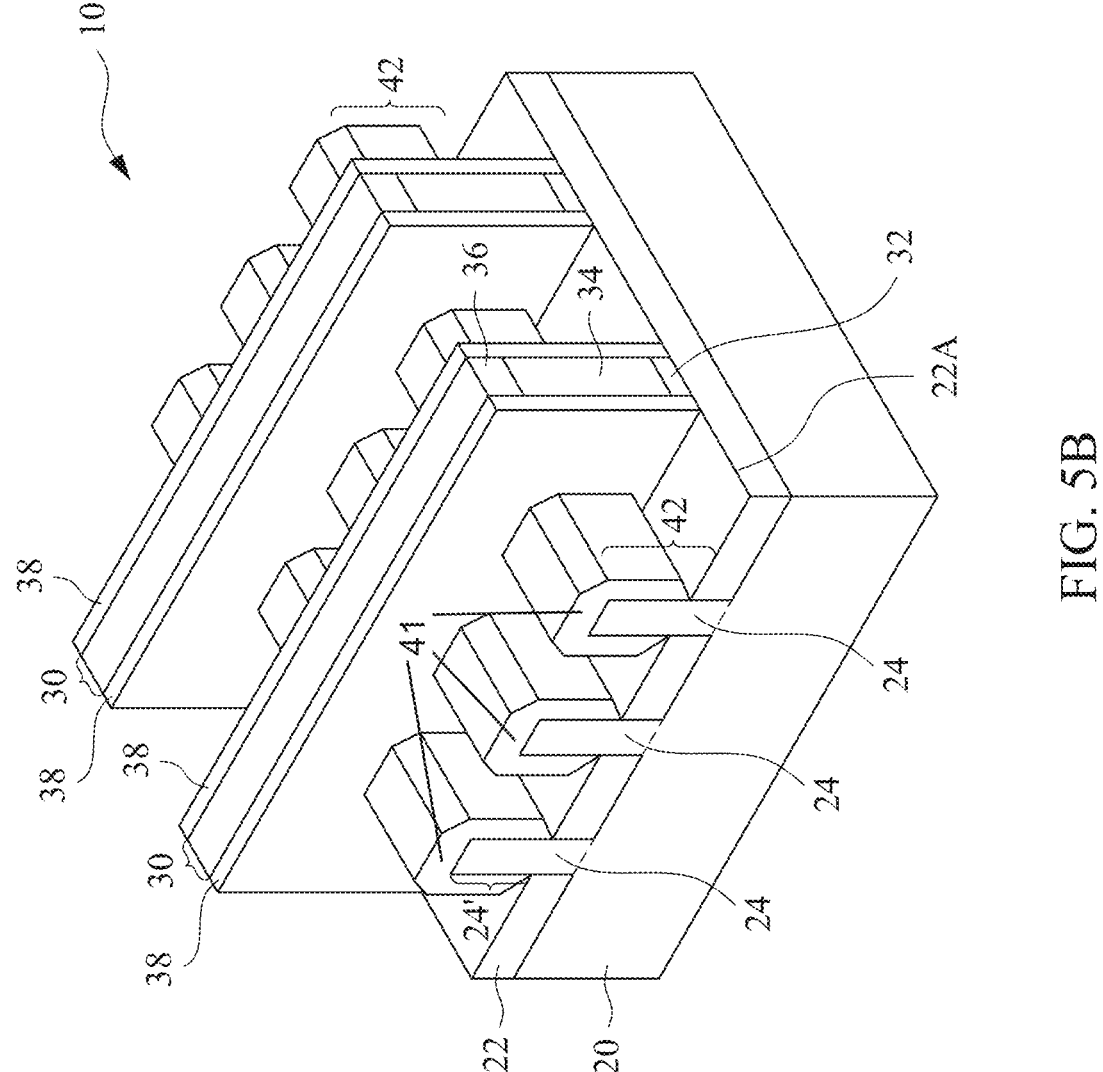

FIG. 5B illustrates the formation of source/drain regions 42 in accordance with alternative embodiments of the present disclosure. In accordance with these embodiments, the protruding fins 24' as shown in FIG. 3 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drains 42 include protruding fins 24' and epitaxy regions 41. An implantation may be performed to implant an n-type impurity or a p-type impurity.

Figure 6:
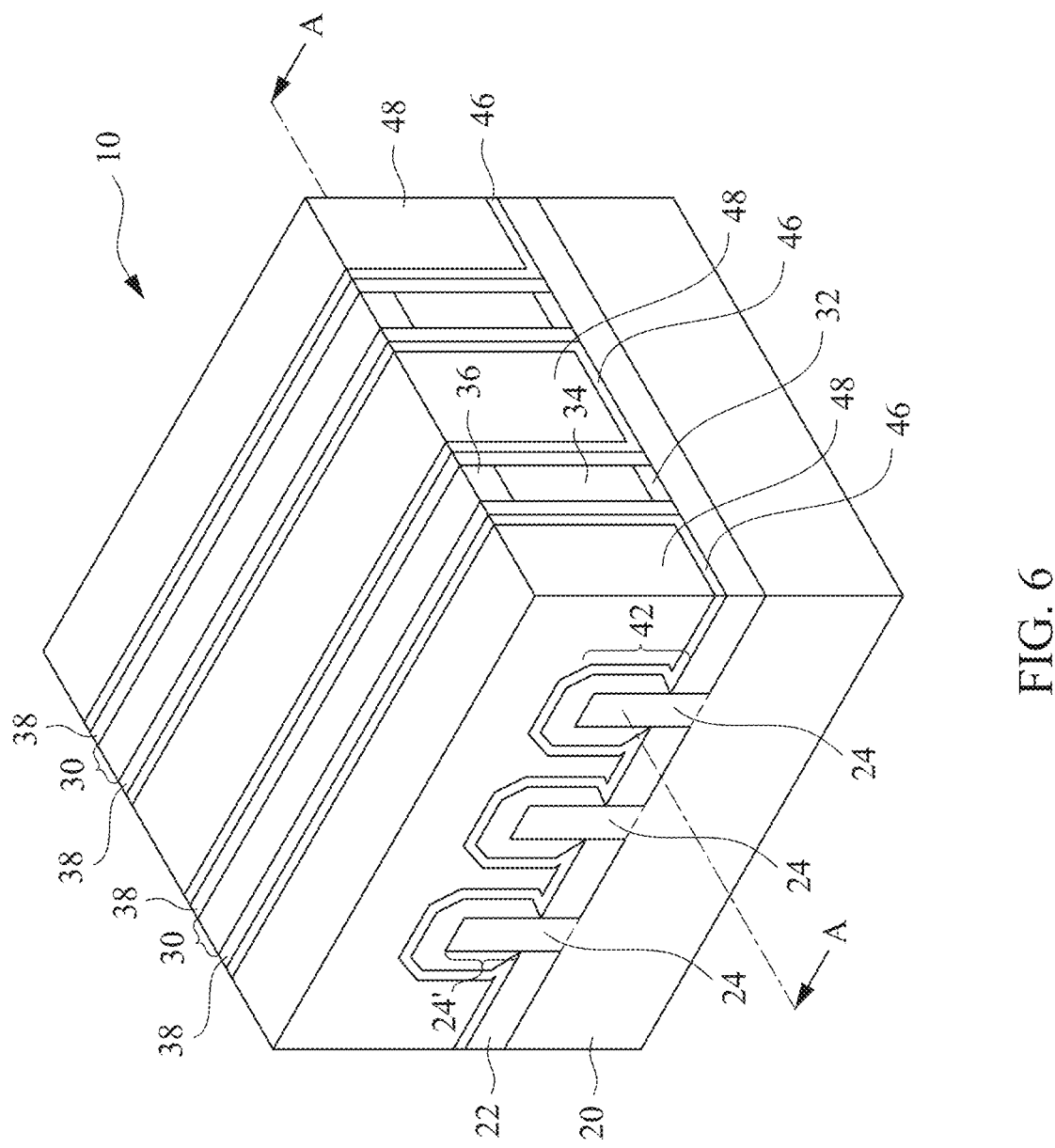

FIG. 6 illustrates a perspective view of the structure after the formation of Contact Etch Stop Layer (CESL) 46 and Inter-Layer Dielectric (ILD) 48. The respective process is illustrated as process 506 in the process flow 500 as shown in FIG. 28. CESL 46 may be omitted. In accordance with some embodiments of the present disclosure, and when formed, may be formed of silicon nitride, silicon carbo-nitride, or the like. In accordance with some embodiments of the present disclosure, CESL 46 is free from oxygen therein. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide based such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as Chemical Mechanical Polish (CMP) process or a mechanical grinding process may be performed to level the top surfaces of ILD 48, dummy gate stacks 30, and gate spacers 38 with each other.

Figure 7:
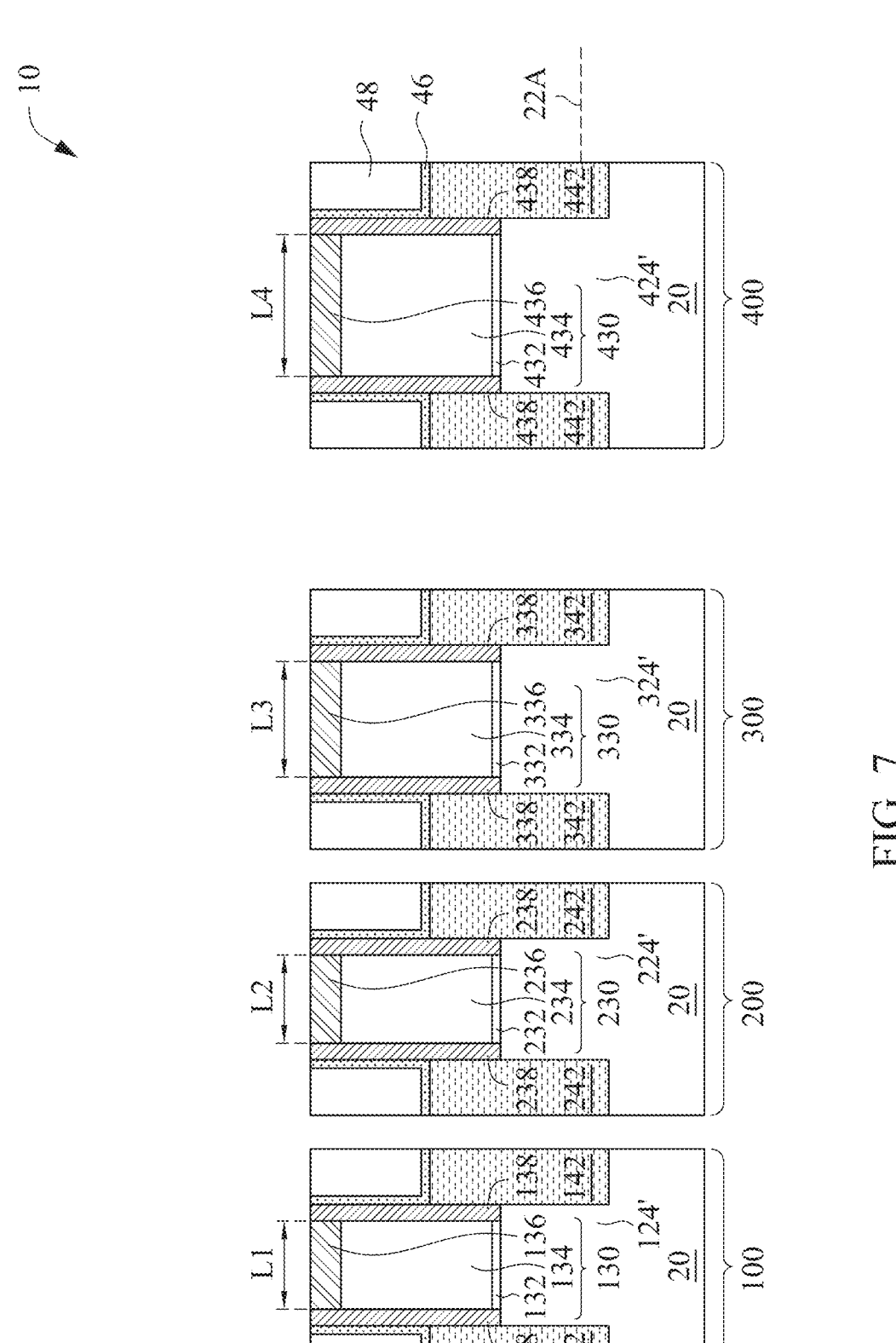

FIG. 7 illustrates the cross-sectional views of an initial structure in the formation of an n-type FinFET short-channel FinFET, a p-type FinFET short-channel FinFET, a mid-channel FinFET, and a long-channel FinFET, which are formed in device regions 100, 200, 300, and 400, respectively. The cross-sectional view of each of the illustrated FinFET regions shown in FIG. 7 may correspond to the cross-sectional view obtained from the vertical plane containing line A-A in FIG. 6. The formation details of each of the devices in regions 100, 200, 300, and 400 as shown in FIG. 7 may be found in FIGS. 1 through 6. The features in device regions 100, 200, 300, and 400 correspond to the features shown in FIG. 6, except some feature numbers in FIG. 6 may be increased by number "100," "200," "300," or "400," to distinguish these features from each other. For example, dummy gate stack 130 in device region 100 includes dummy gate dielectric 132, dummy gate electrode 134, and hard mask 136, which correspond to the dummy gate dielectric 32, dummy gate electrode 34, and hard mask 36 in FIG. 6. Source/drain regions 142, 242, 342, and 442 are formed in device regions 100, 200, 300, and 400, respectively. Also, gate spacers 138, 238, 338, and 438 are formed in device regions 100, 200, 300, and 400, respectively.

Line 22A is shown to represent the level of the top surface of STI regions 22 (FIG. 7). Semiconductor fins 124', 224', 324', and 424' protrude higher than top surfaces 22A. The channel length (gate width) of the FinFETs in device regions 100, 200, 300, and 400 are L1, L2, L3, and L4, respectively. In accordance with some embodiments of the present disclosure, it is assumed that L1=L2<L3<L4. In accordance with some embodiments of the present disclosure, gate lengths L1 and L2 of the short-channel FinFETs are smaller than about 17 nm. The gate length L3 of the mid-channel FinFET is in the range between about 38 nm and about 50 nm. The gate length L4 of the long-channel FinFET is in the range between about 90 nm and about 260 nm. It is appreciated that whether a gate is a long-channel gate, a mid-channel gate, or a short-channel gate is relative, and the ranges of the gate lengths may be different from the aforementioned.

Figure 8:
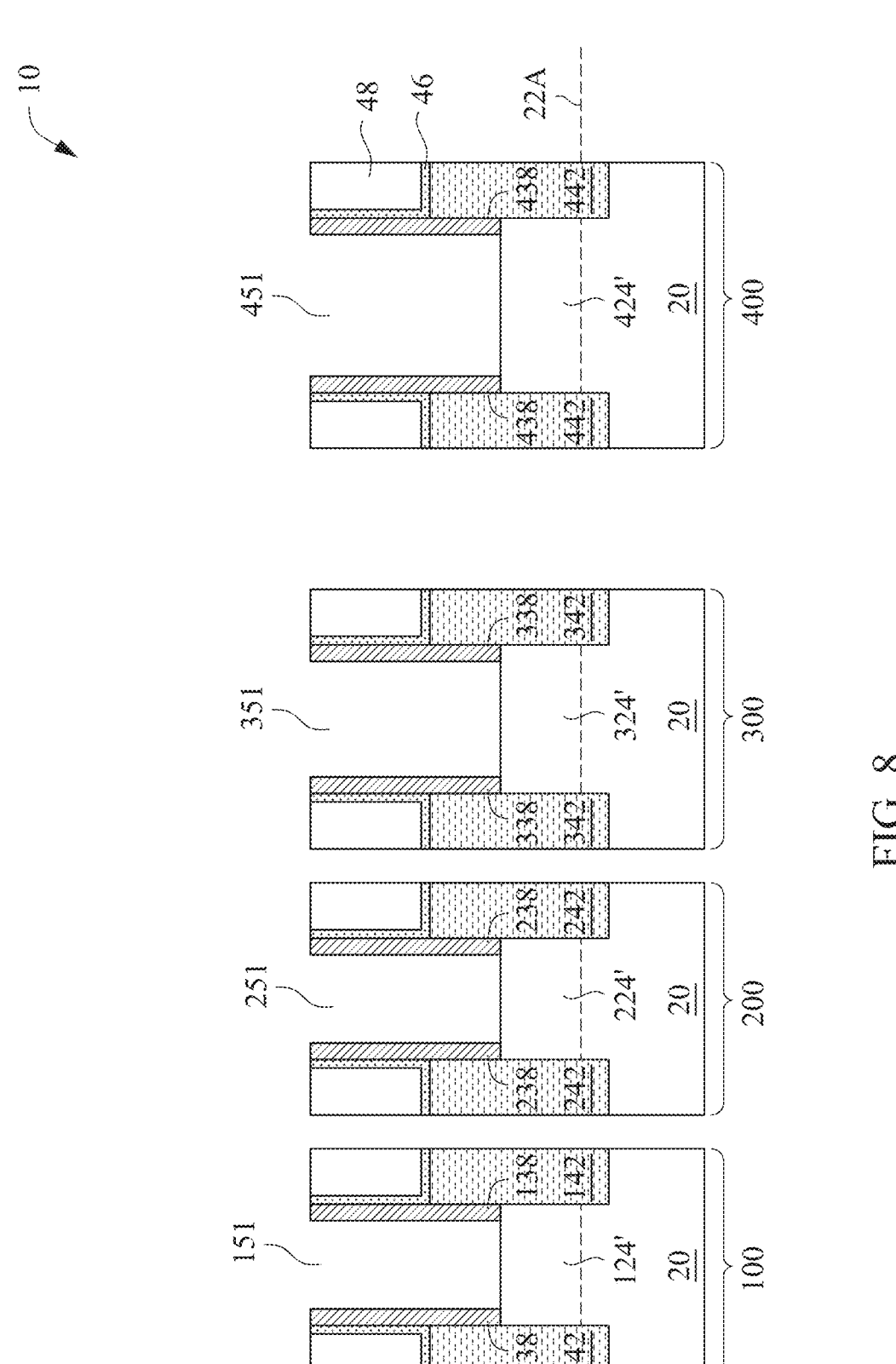

Next, dummy gate stacks 130, 230, 330, and 430 are removed, forming openings 151, 251, 351, and 451, respectively, and the resulting structure is shown in FIG. 8. The respective process is illustrated as process 508 in the process flow 500 as shown in FIG. 28. The top surfaces and the sidewalls of protruding semiconductor fins 124', 224', 324', and 424' may be exposed to openings 151, 251, 351, and 451, respectively.

Figure 9:
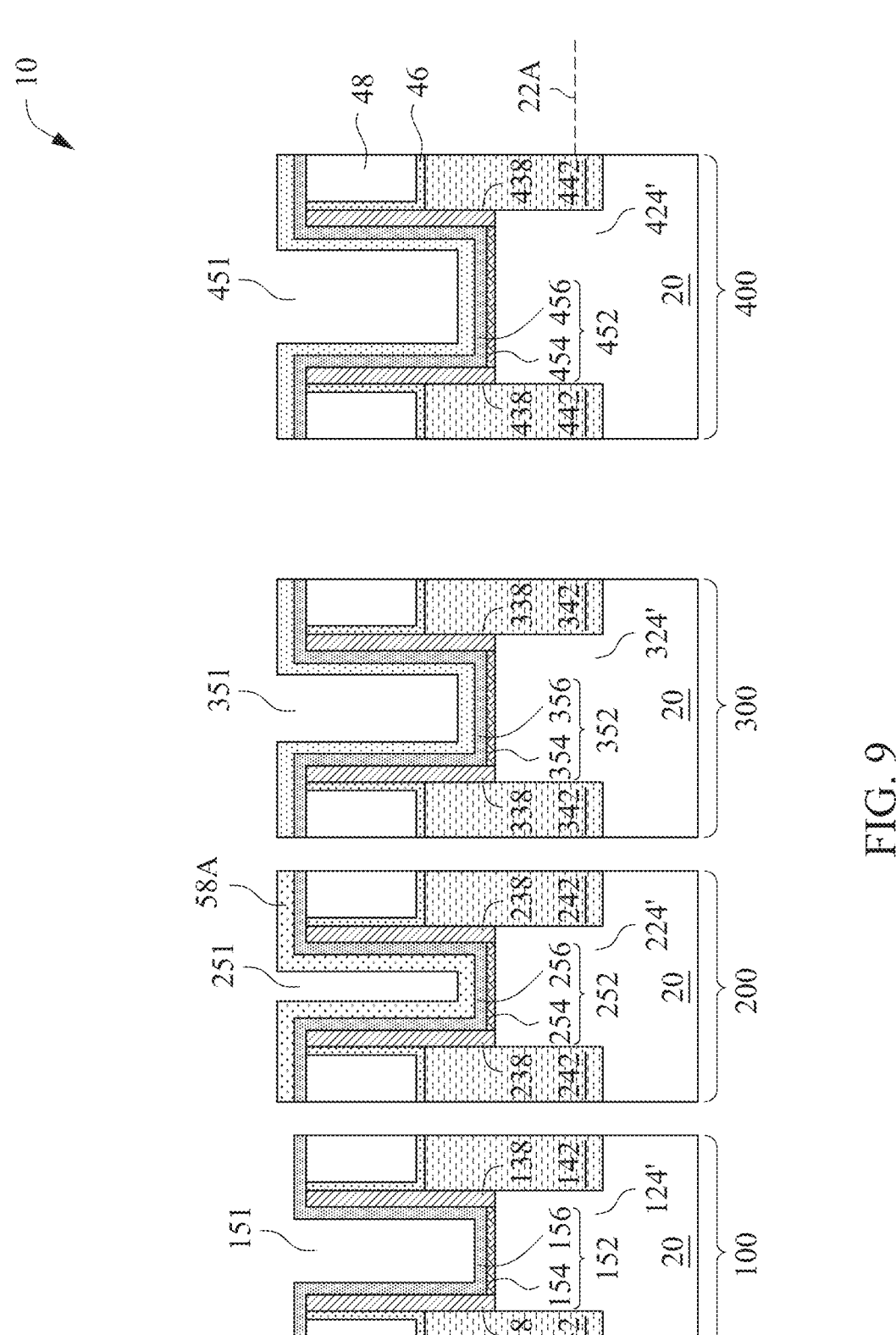

Next, referring to FIG. 9, (replacement) gate dielectric layers 152, 252, 352, and 452 are formed in device regions 100, 200, 300, and 400, respectively. The respective process is illustrated as process 510 in the process flow 500 as shown in FIG. 28. Gate dielectric layers 152, 252, 352, and 452 extend into openings 151, 251, 351, and 451 (FIG. 8), respectively. In accordance with some embodiments of the present disclosure, gate dielectric layers 152, 252, 352, and 452 include Interfacial Layer (IL) 154, 254, 354, and 454, respectively, as their corresponding lower parts. ILs 154, 254, 354, and 454 are formed on the exposed surfaces of the protruding fins. ILs 154, 254, 354, and 454 may include an oxide layer such as a silicon oxide layer, which is formed through the thermal oxidation of protruding fins 124', 224', 324', and 424', a chemical oxidation process, or a deposition process. ILs 154, 254, 354, and 454 may be formed simultaneously in a common process.

Gate dielectric layers 152, 252, 352, and 452 may also include high-k dielectric layers 156, 256, 356, and 456 formed over the corresponding ILs. High-k dielectric layers 156, 256, 356, and 456 may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. High-k dielectric layers 156, 256, 356, and 456 are formed as conformal layers, and extend on the sidewalls of protruding fins 124', 224', 324', and 424' and the sidewalls of the corresponding gate spacers 138, 238, 338, and 438. In accordance with some embodiments of the present disclosure, high-k dielectric layer 156, 256, 356, and 456 are formed using ALD or CVD. High-k dielectric layers 156, 256, 356, and 456 may be formed simultaneously in a common process.

Figure 10:
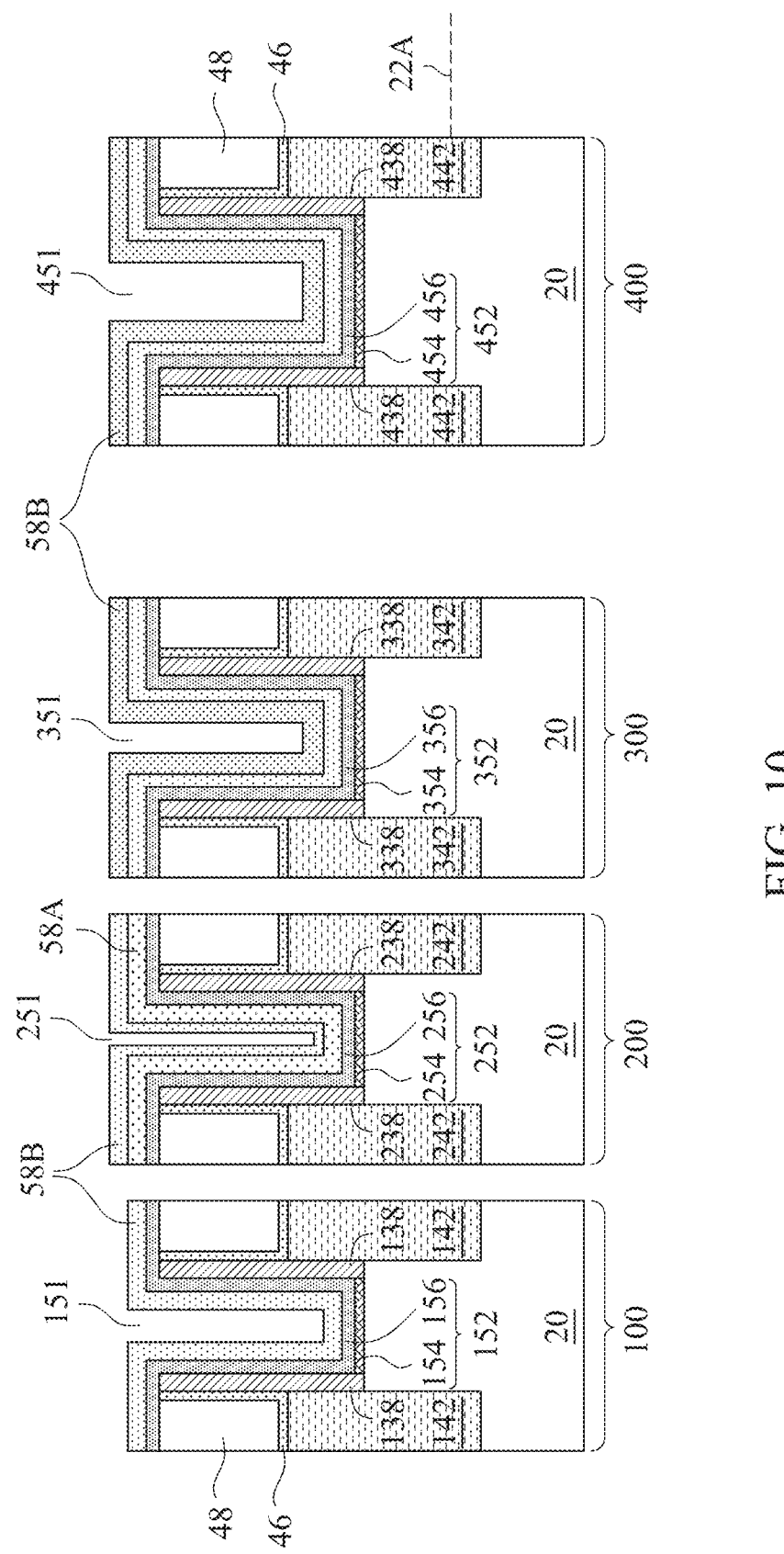
Figure 11:
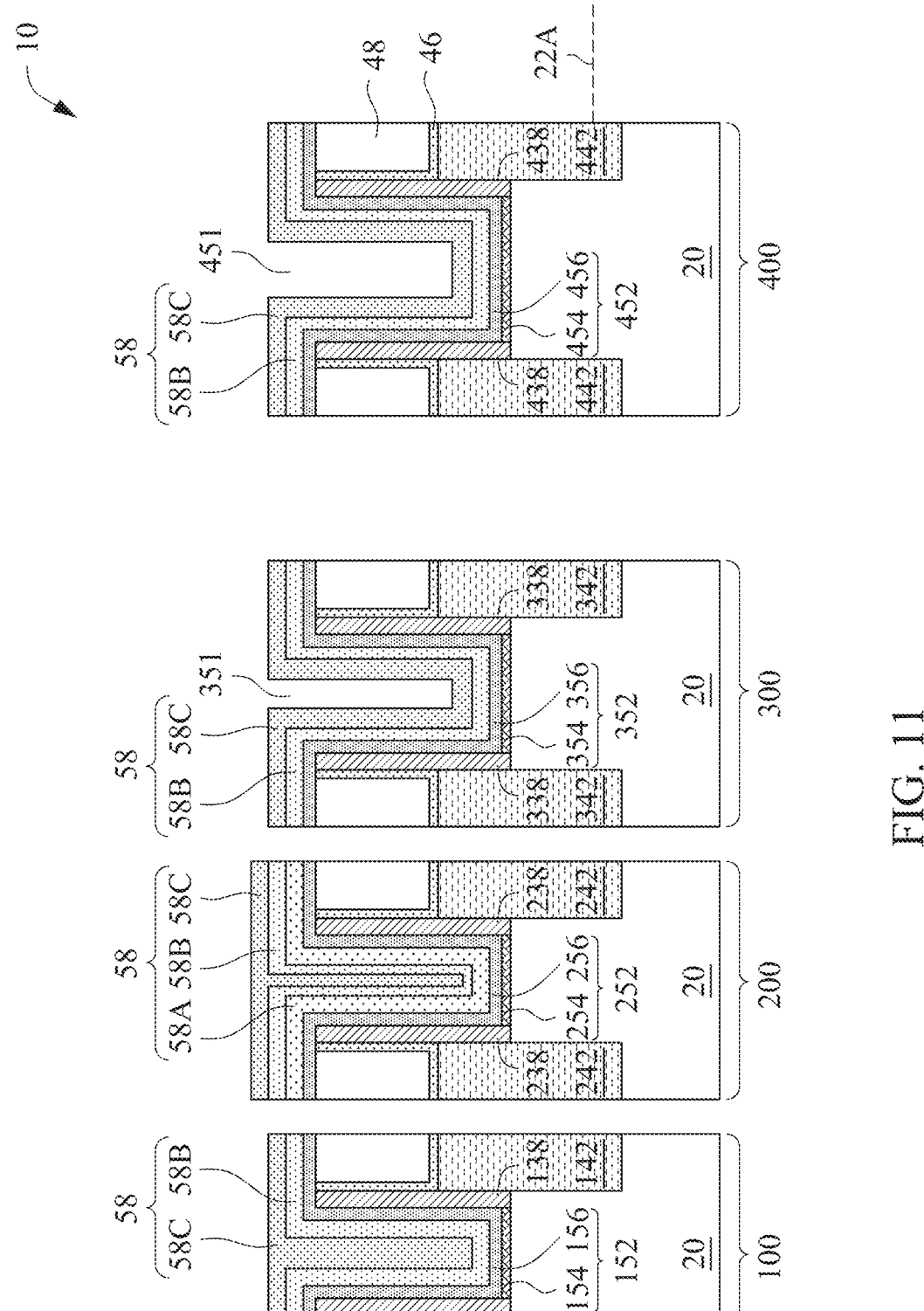

FIGS. 9 through 11 illustrate the formation of some metal layers, which form parts of replacement metal gates. The respective process is illustrated as process 512 in the process flow 500 as shown in FIG. 28. The illustrated metal layers may include work-function layers, whose work-functions affect the threshold voltages of the corresponding FinFETs. The metal layers may or may not include non-work function metal layers underlying and/or overlying the work-function layers, with the work-functions of the non-work-function metal layers not affecting the threshold voltages of the resulting FinFETs. For example, the metal layers may include tungsten layers overlying the work-function layers, and the tungsten layers are not work-function layers. The metal layers as presented in the illustrated embodiments are merely examples, and different combinations of metal layers may be adopted. Also, each of the illustrated metal layers may or may not extend into any of the device regions 100, 200, 300, 400 in accordance with other embodiments.

In FIGS. 9 through 11, stacked metal layers 58 (FIG. 11) are formed. The materials of each layer in stacked metal layers 58 may be selected based on whether the respective FinFET is an n-type FinFET or a p-type FinFET. Stacked metal layers 58 may include layers 58A, 58B and 58C, which are individually and in combination referred to as metal layers 58. For example, when the FinFET is an n-type FinFET, the work-function layer in stacked metal layers 58 may include a TaN layer and a titanium aluminum (TiAl) layer over the TaN layer. When the FinFET is a p-type FinFET, the work-function layer in stacked metal layers 58 may include a TaN layer, a TiN layer over the TaN layer, and a TiAl layer over the TiN layer. The work-function layers may also include TiAlC, TaSiC, or the like. The thickness of each of the work-function layer and the diffusion barrier layer may be smaller than about 5 nm, for example, between about 1 nm and about 5 nm. In accordance with some embodiments of the present disclosure, stacked metal layers

58 are performed using a conformal deposition method such as ALD or CVD, so that the thickness of the vertical portions and the thickness of the horizontal portions of stacked metal layers 58 (and each of sub-layers) are equal to or substantially equal to each other, for example, with the difference between the thicknesses of horizontal portions and vertical portions being smaller than about 20 percent or 10 percent of the thicknesses of the horizontal portions. In subsequent discussion, the materials and the formation methods of layers 58A, 58B, and 58C are not discussed separately.

Referring to FIG. 9, a first metal layer 58A, which may be a work-function layer, is formed in device region 200. The formation process may include blanket forming metal layer 58A, and removing metal layer 58A from device regions 100, 300, and 400, for example, through a photo lithography process.

FIG. 10 illustrates the deposition of metal layer 58B. Metal layer 58B extends into openings 151, 251, 351, and 451, and covers metal layer 58A. In accordance with some embodiments of the present disclosure, each of openings 151, 251, 351, and 451 has a portion left unfilled.

FIG. 11 illustrates the deposition of metal layer 58C. In accordance with some embodiments of the present disclosure, the remaining openings 151 and 251 are fully filled. The process is controlled so that the deposition of metal layer 58C is stopped as soon as openings 151 and 251 are fully filled. In the illustrated example, since opening 251 is filled earlier than opening 151, the deposition of metal layer 58C is stopped as soon as opening 151 is fully filled. The over-fill is selected to be as small as possible (providing a process margin is kept to ensure the full filling of openings 151 and 251). Openings 351 and 451 still have portions left un-filled when the deposition of metal layer 58C is stopped. In accordance with some embodiments of the present disclosure, after the full filling of opening 151, less than 5 nm (or less than 2 nm) thick of metal layer 58C is deposited as over-fill when the deposition is stopped.

Figure 12:
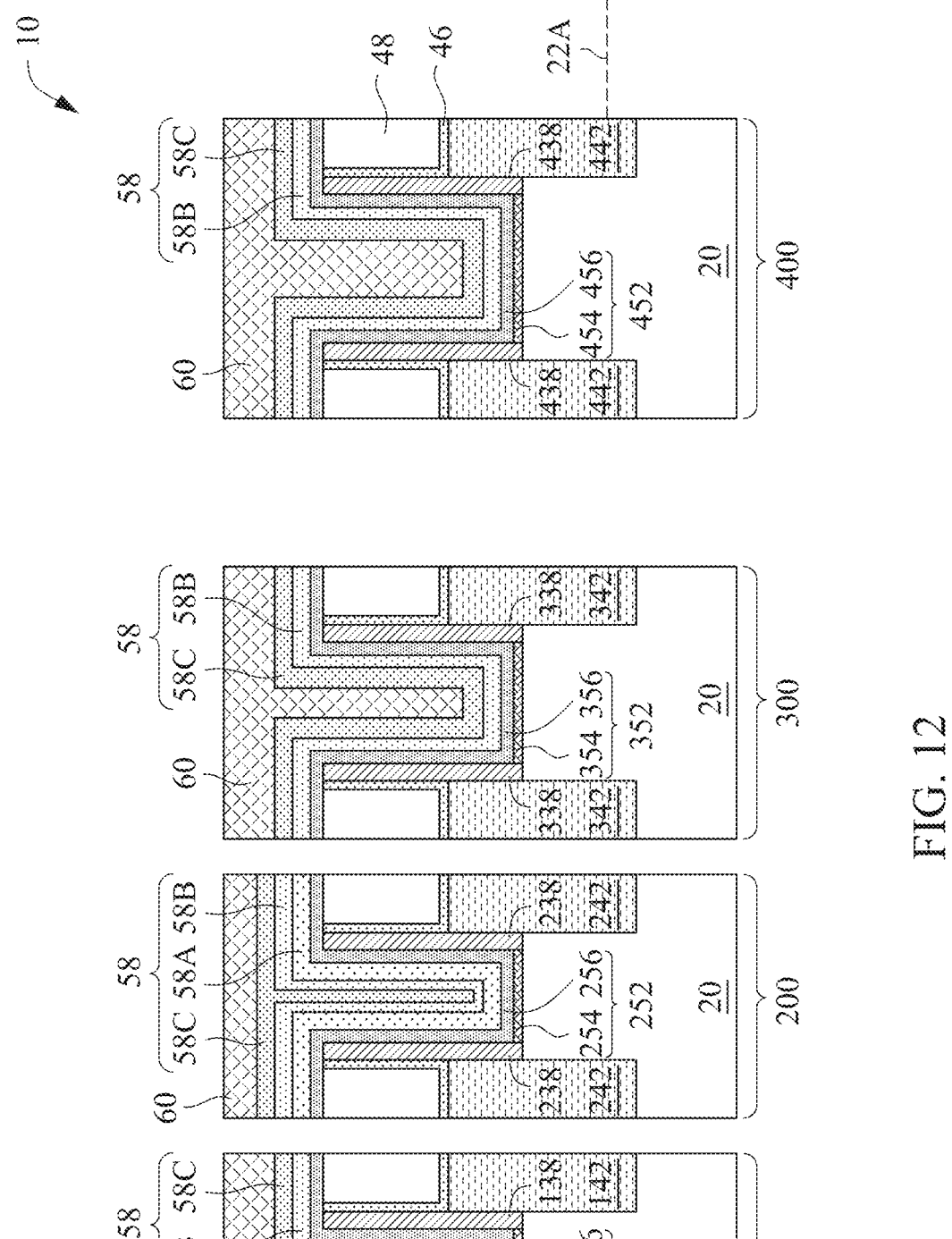

Next, referring to FIG. 12, filling layer 60 is deposited to fill the remaining portions of openings 351 and 451 (FIG. 11). The respective process is illustrated as process 514 in the process flow 500 as shown in FIG. 28. In accordance with some embodiments of the present disclosure, filling layer 60 is formed of a dielectric material, which is different from the materials of gate spacers 138/238/338/438, and ILD 48, and possibly different from (or the same as) the material of CESL 46. For example, filling layer 60 may be formed of silicon nitride, silicon oxide, silicon carbo-nitride, or the like. Filling layer 60 may also be formed of polysilicon, amorphous silicon, or the like.

Figure 13:
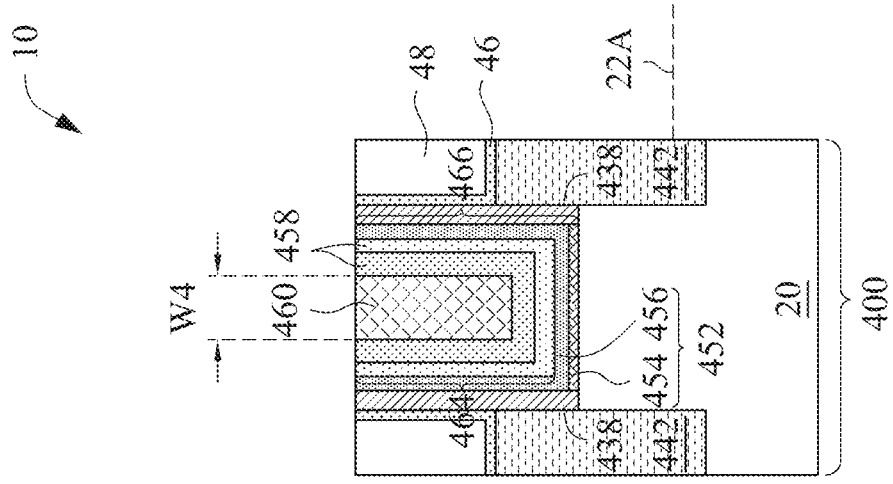
Figure 13:
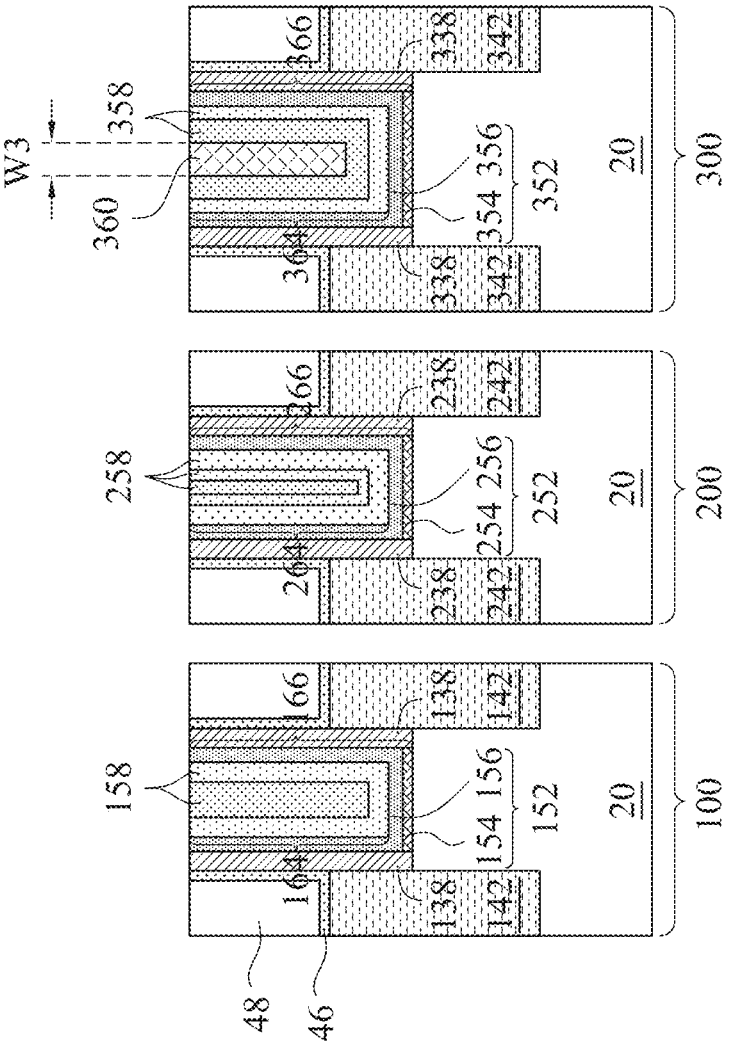

FIG. 13 illustrates a planarization process to remove excess portions of stacked metal layers 58. The respective process is also illustrated as process 514 in the process flow 500 as shown in FIG. 28. The planarization process may be a Chemical Mechanical Polish (CMP) process or a mechanical grinding process. The planarization may be performed using ILD 48 as a stop layer. In accordance with alternative embodiments, the planarization is performed using the horizontal portions of high-k dielectric layers 156/256/356/456 as a stop layer, and hence the horizontal portions of the high-k dielectric layers may have some remaining portions after the planarization process. As a result of the planarization, as shown in FIG. 13, replacement (metal) gate electrodes 164, 264, 364, and 464 are formed, which include the remaining portions 158, 258, 358, and 458 of metal layers 58 in device regions 100, 200, 300, and 400, respectively. Throughout the description, replacement gate electrodes 164, 264, 364, and 464 in combination with the respective underlying gate dielectrics 152, 252, 352, and 452 are referred to as replacement gate stacks 166, 266, 366, and 466, respectively. The remaining portions of filling layer 60 are referred to as filling regions 360 and 460. Filling region 460 is wider the filling region 360, with width W4 greater than width W3. In accordance with some embodiments of the present disclosure, filling region 360 has width W3 in the range between about 15 nm and about 40 nm, and filling region 460 has width W4 in the range between about 70 nm and about 245 nm.

Figure 14:
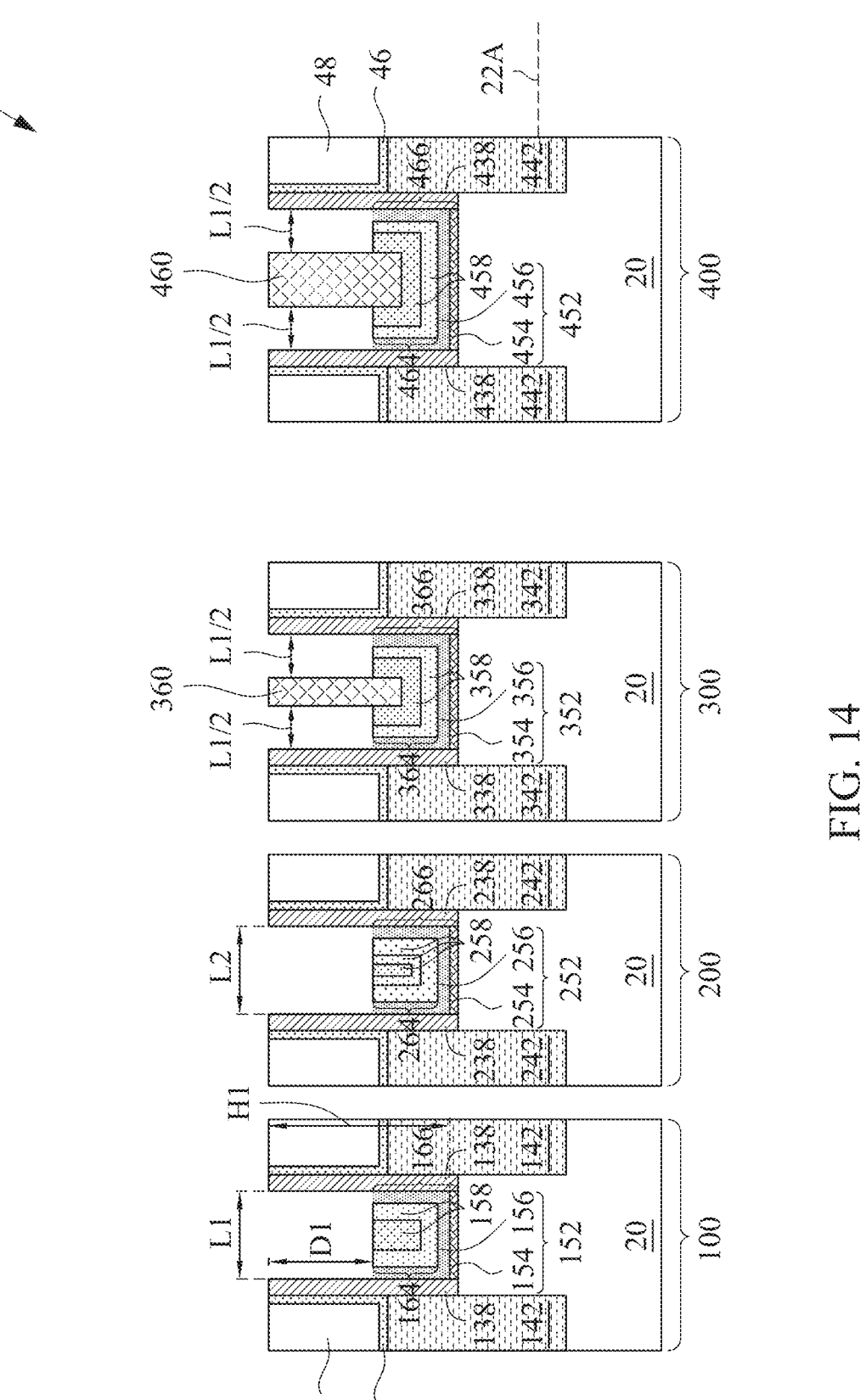

FIG. 14 illustrates the etch-back of replacement gate stacks 166, 266, 366, and 466. The respective process is illustrated as process 516 in the process flow 500 as shown in FIG. 28. In the etch-back, high-k gate dielectrics 156, 256, 356, and 456 are etched back. In addition, replacement gate electrodes 164, 264, 364, and 464 are etched back. Accordingly, the respective process is also referred to as the etch-back of replacement gate electrodes 164, 264, 364, and 464. In accordance with some embodiments of the present disclosure, the etch-back is performed using a chemical that attacks replacement gate electrodes 164, 264, 364, and 464 (and the high-k dielectric materials and the metal thereon), and does not attack gate spacers 138/238/338/438, ILD 48, and filling regions 360 and 460. In accordance with some embodiments of the present disclosure, the etch-back is performed using chlorine-based process gases. For example, the etch-back may be performed using a mixture of $Cl_2$ and $BCl_3$. The chorine-based gases have high etch selectivity value, wherein the etch selectivity is the ratio of the etching rate of replacement gate electrodes 164/264/364/464 to the etching rate of filling regions 360 and 460. For example, the etching selectivity may be greater than about 25 or higher, such as greater than about 50.

In accordance with some embodiments of the present disclosure, due to the formation of filling regions 360 and 460, which occupy the spaces that will otherwise be occupied by metal gates, the gate widths (measured in the channel-length directions) of the regions that are etched are more uniform throughout device regions 100, 200, 300, and 400. For example, assuming gate width L1 is equal to L2, the widths of the etched regions in device regions 100, 200, 300, and 400 are all equal to or close to L1, as shown in FIG. 14. Accordingly, the pattern-loading effect in the etch-back is at least reduced, and may be substantially eliminated. After the etch-back, the top surfaces of gate stacks 166, 266, 366, and 466 may be at substantially a same level. As a result of the etch back, the top surfaces of gate stacks 166, 266, 366, and 466 are recessed by depth D1, which is greater than about 60 nm, and may be in the range between about 60 and about 80 nm. The ratio D1/H1 may also be in the range between about 0.6 and about 0.8.

In accordance with some embodiments of the present disclosure, the etch-back is stopped when the top surfaces of the remaining gate stacks 366 and 466 are higher than the bottoms of filling regions 360 and 460. In accordance with some embodiments of the present disclosure, the etch-back is stopped when the top surfaces of the remaining gate stacks 366 and 466 are substantially level with (with a slight process margin) the bottoms of filling regions 360 and 460, so that filling regions 360 and 460 do not collapse. After the etch-back, the top surfaces of filling regions 360 and 460 are at substantially the same level as the top surface of ILD 48.

Figure 15:
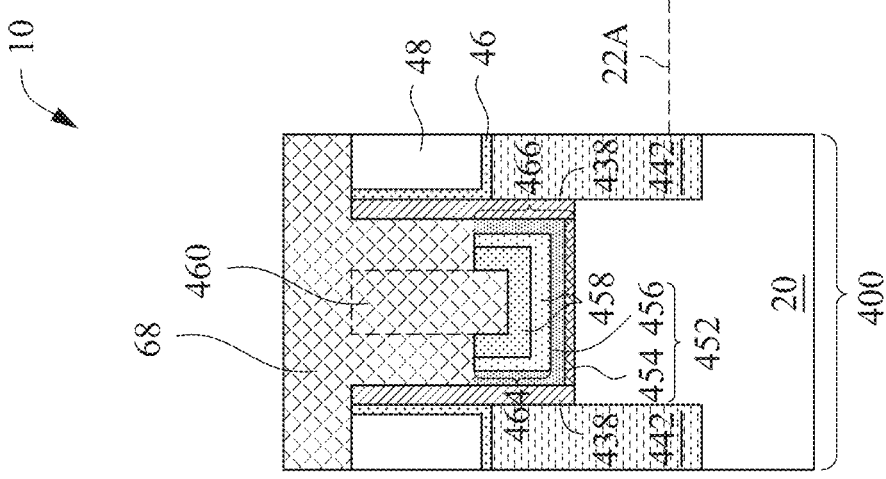
Figure 15:
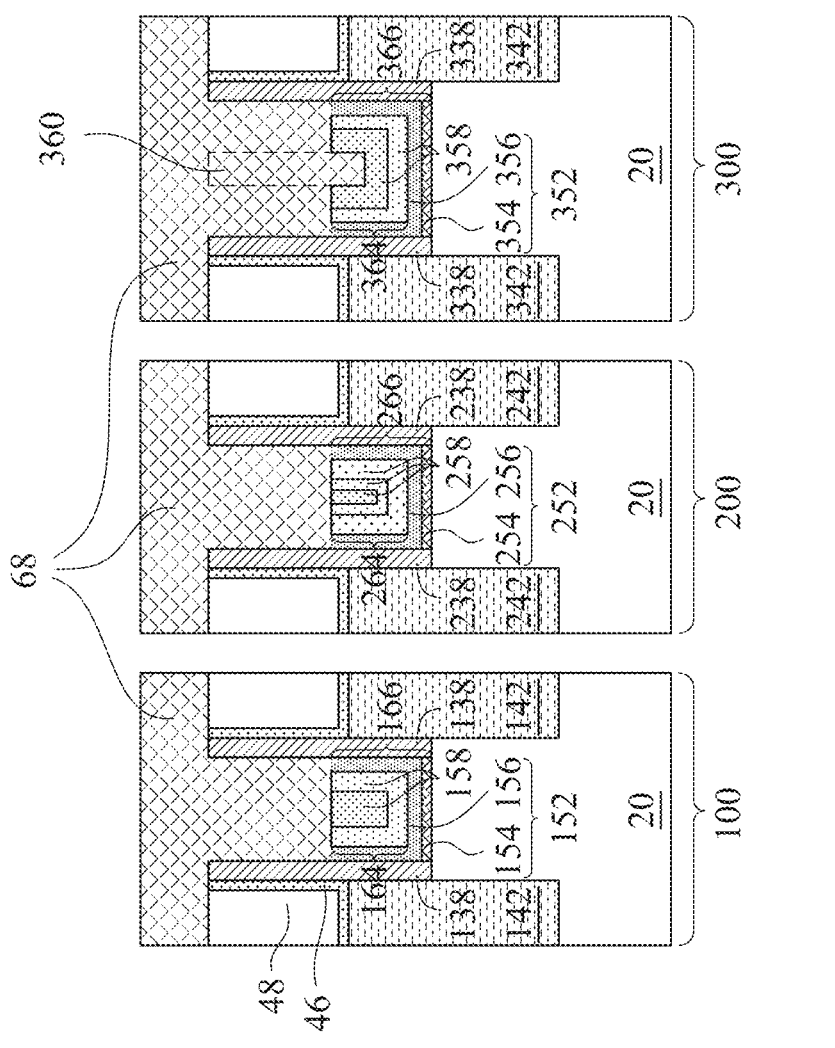

FIG. 15 illustrates the deposition of dielectric material 68. The respective process is illustrated as process 518 in the process flow 500 as shown in FIG. 28. In accordance with some embodiments in which filling regions 360 and 460 are formed of a non-dielectric material such as polysilicon or amorphous silicon, filling regions 360 and 460 are removed first in an etching process before dielectric material 68 are deposited. In accordance with some embodiments in which filling regions 360 and 460 are formed of a dielectric material, filling regions 360 and 460 may be removed through etching, or may be left un-removed, and dielectric material 68 are deposited on filling regions 360 and 460. Accordingly, filling regions 360 and 460 are shown using dashed lines to indicate they may or may not be replaced. Dielectric material 68 may be formed of silicon nitride, silicon oxide, silicon carbo-nitride, or the like. The formation method may include plasma enhance chemical vapor deposition, CVD, ALD, or the like. Dielectric material 68 and filling regions 360 and 460 may or may not have distinguishable interfaces, regardless of they are formed of the same or different materials. Furthermore, dielectric material 68 may be formed of a same dielectric material as, or a material different from, that of filling regions 360 and 460.

Figure 16:
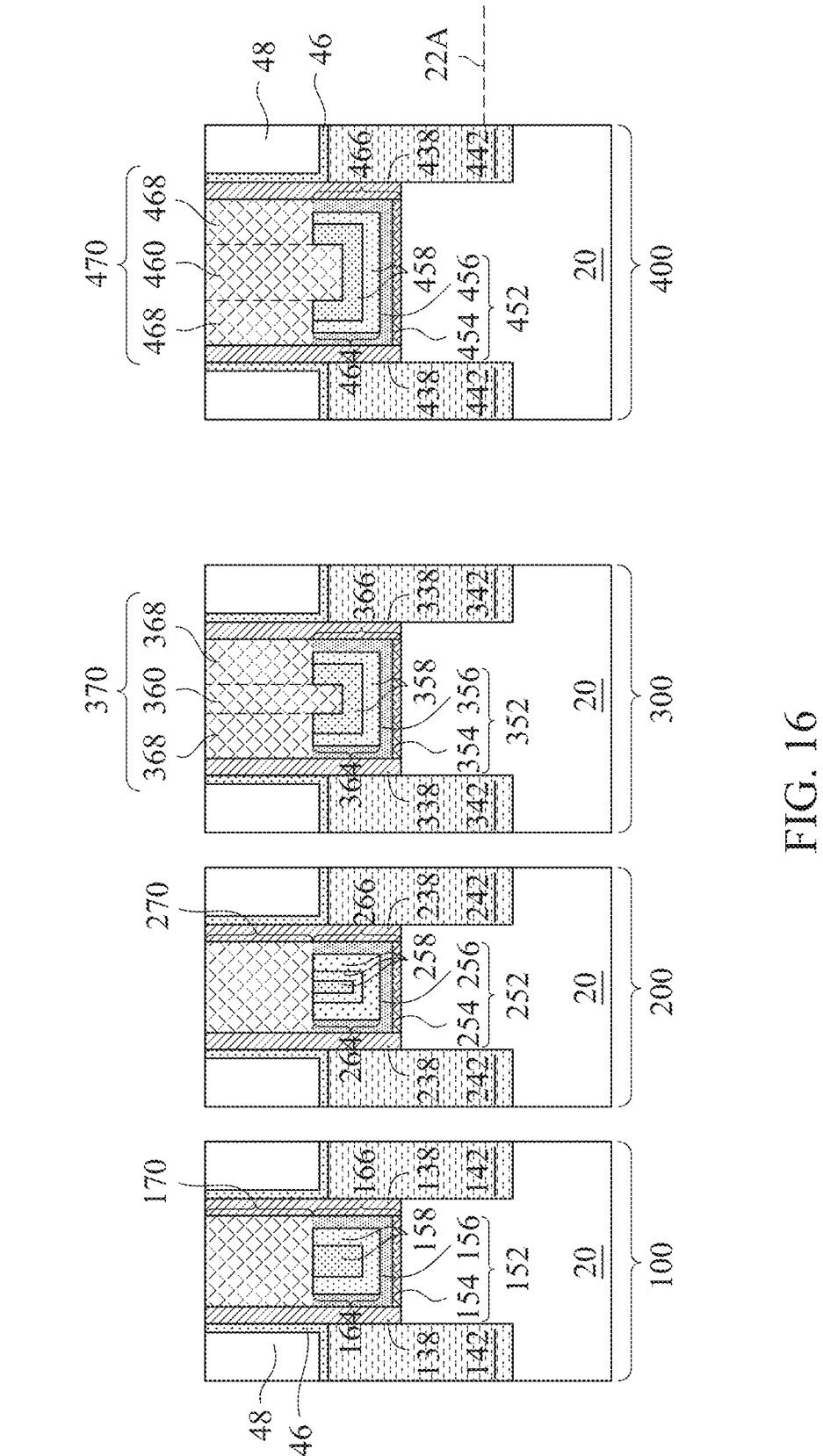

A planarization process such as a CMP process or a mechanical polish process is then performed to remove excess portions of dielectric material 68, resulting in hard masks 170, 270, 370, and 470, as shown in FIG. 16. The respective process is illustrated as process 520 in the process flow 500 as shown in FIG. 28. In accordance with some embodiments of the present disclosure, hard masks 170 and 270 are formed of a homogenous material. In the illustrated cross-sectional view, hard masks 370 and 470 may or may not include the remaining portions 360 and 460, respectively. Hard masks 370 and 470 also include the remaining dielectric portions 368 and 468, respectively, of dielectric material 68. In accordance with some embodiments of the present disclosure, the bottoms of portions 360 and 460 protrude downwardly to levels lower than the bottom surfaces of the dielectric portions 368 and 468. Also, metal layers 358 and 458 form basins, with portions 360 and 460 extending into the basins.

Figure 17:
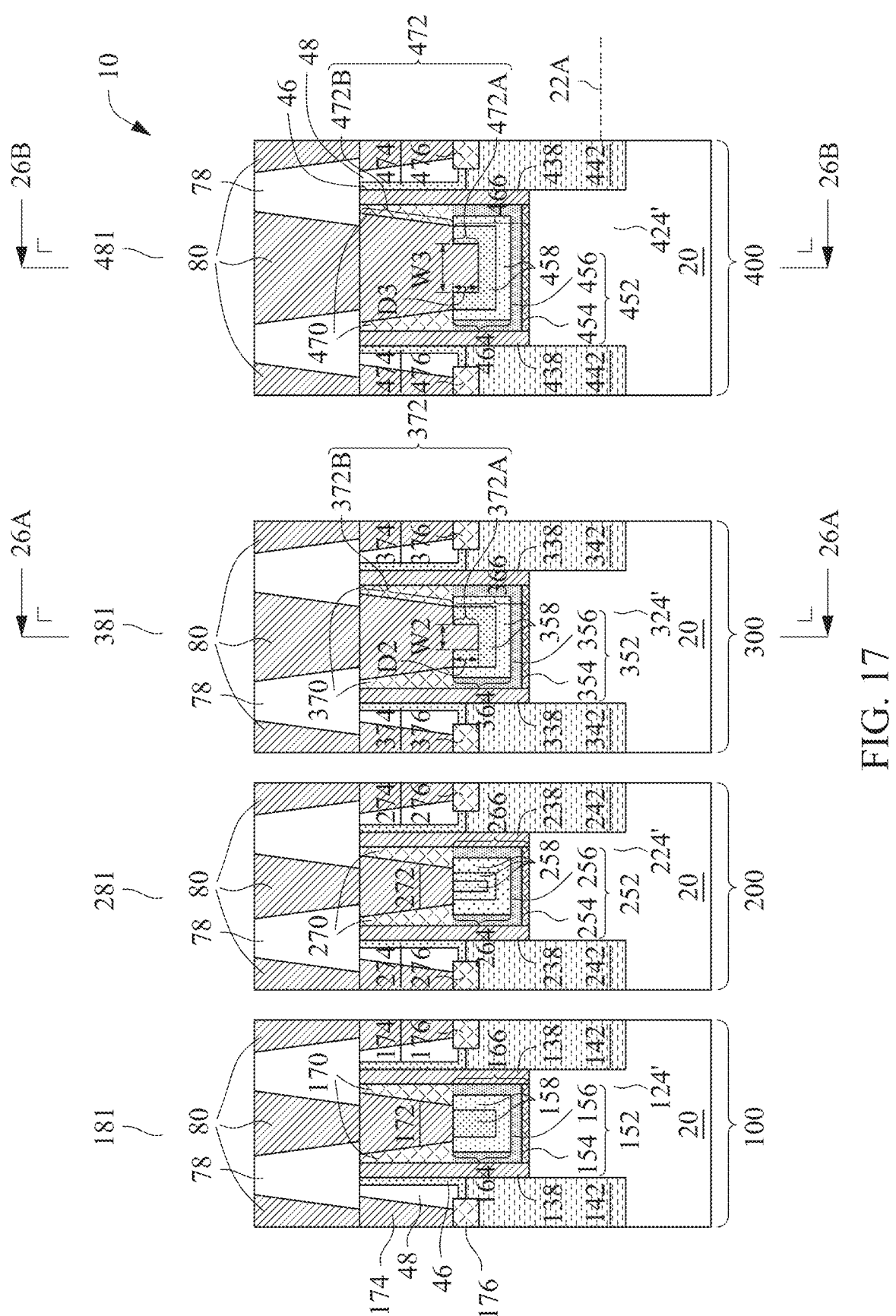

FIG. 17 illustrates the formation of contact plugs 172, 272, 372, and 472. The respective process is illustrated as process 522 in the process flow 500 as shown in FIG. 28. The formation process includes etching hard mask 170, 270, 370, and 470 to form contact openings, filling the openings with a conductive material, such as a metal(s), and performing a planarization process. Source/drain contact plugs 174, 274, 374, and 474, and silicide regions 176, 276, 376, and 476 are also formed to connect to source/drain regions 142, 242, 342, and 442, respectively.

Gate contact plugs 172, 272, 372, and 472 and source/drain contact plugs 174, 274, 374, and 474 may be formed of a metal such as tungsten, cobalt, aluminum, or the like. Each of the contact plugs may include a barrier layer formed of, for example, titanium nitride, tantalum nitride, titanium, tantalum, or the like, and the metal over the barrier layer. The formation of silicide regions 176, 276, 376, and 476 and source/drain contact plugs 174, 274, 374, and 474 may include etching ILD 48 and CESL 46 to form contact openings, depositing a conformal metal layer such as titanium or cobalt, forming a metal nitride layer such as titanium nitride, and performing an annealing to form silicide regions 176, 276, 376, and 476. The remaining contact openings are filled with a metal and possibly another metal nitride layer under the metal. Accordingly, short-channel FinFETs 181 and 281, mid-channel FinFET 381, and long-channel FinFET 481 are formed.

Gate contact plug 372 includes portion 372B higher than the top surface of replacement gate electrode 364, and protruding portion 372A protruding downwardly into the basin formed of gate electrode 364. Protruding portion 372A is fully encircled by a ring formed of a top portion of gate electrode 364. Gate contact plug 472 includes portion 472B higher than the top surface of replacement gate electrode 464, and protruding portion 472A protruding downwardly into the basin formed of gate electrode 464. Protruding portion 472A is fully encircled by a ring formed of a top portion of gate electrode 464.

FIG. 17 also illustrates ILD 78 and contact plugs 80. ILD 78 may be formed of a material selected from the same group of candidate materials as ILD 48. ILD 78 may also be formed of a material different from that of hard masks 170, 270, 370, and 470. Contact plugs 80 are formed in ILD 78 to connect to the underlying gate contact plugs and source/drain contact plugs.

As shown in FIG. 17, protruding portion 372A has depth D2 and width W2. In accordance with some embodiments of the present disclosure, depth D2 is in the range between about 10 nm and about 20 nm. Width W2 is in the range between about 30 nm and about 40 nm. Aspect ratio D2/W2 may be in the range between about 0.25 and about 0.67. Protruding portion 472A has depth D3 and width W3. In accordance with some embodiments of the present disclosure, depth D3 is in the range between about 10 nm and about 20 nm. Width W3 is in the range between about 240 nm and about 245 nm. Aspect ratio D3/W3 may be in the range between about 0.04 and about 0.08. Aspect ratio D2/W2 is greater than aspect ratio D3/W3. Furthermore, ratio W3/W2 is greater than 1.0, and may be greater than about 6. Ratio W3/W2 may be in the range between about 6 and about 8.2 in accordance with some embodiments of the present disclosure.

Figure 26:
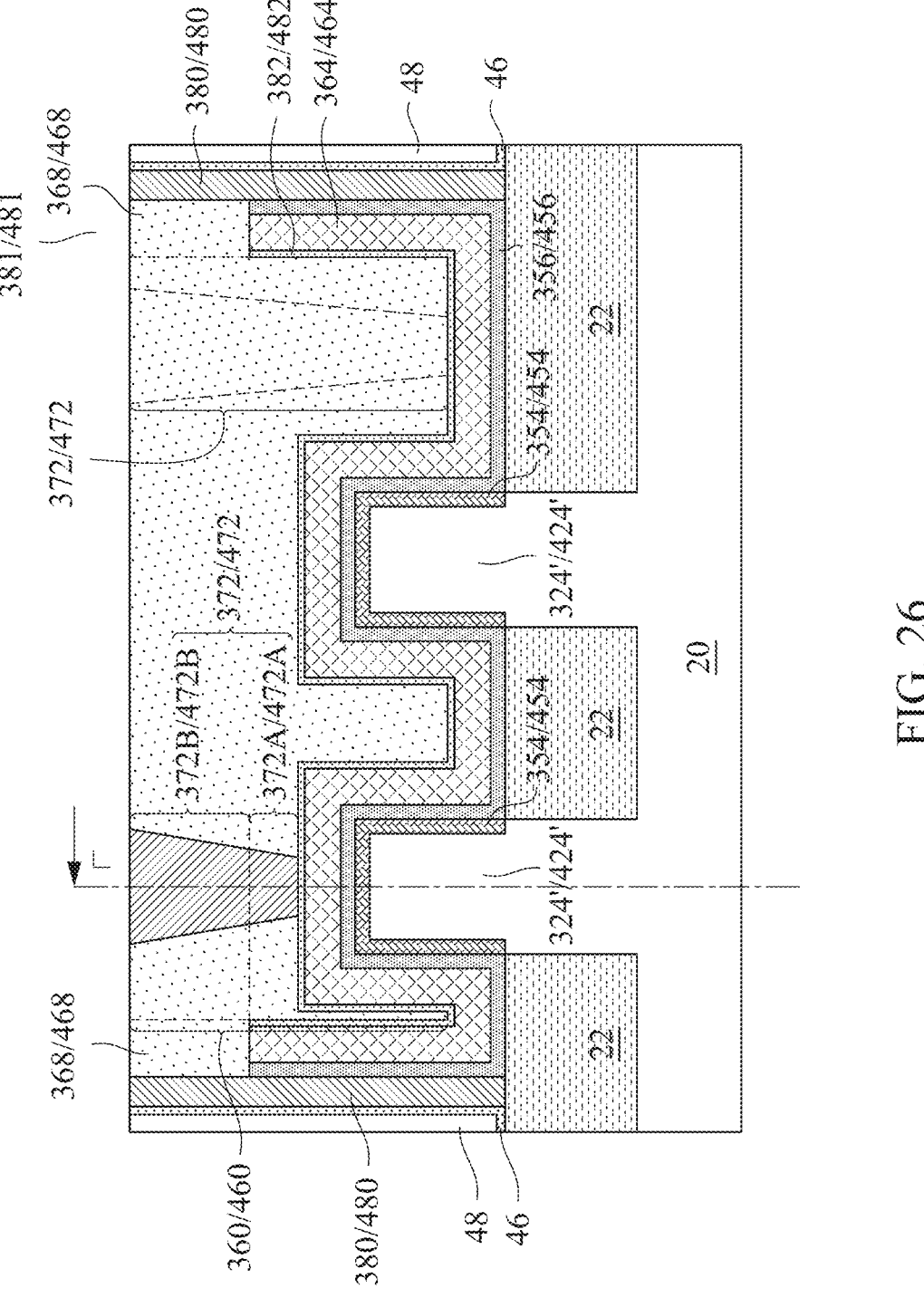
FIGS. 26 and 27 are a cross-sectional view and a top view, respectively, of a replacement gate of a FinFET in accordance with some embodiments.

FIG. 26 illustrates a cross-sectional view of FinFET 381 or 481, wherein corresponding features shown in FIG. 17 are illustrated. The cross-sectional view may be obtained from the plane crossing line 26A-26A or line 26B-26B in FIG. 17. Contact plug 372 or 472 (denoted as 372/472) is also shown. Contact plug 372/472 may be formed on top of fins 324'/424', or at the position marked using dashed lines.

Figure 27:
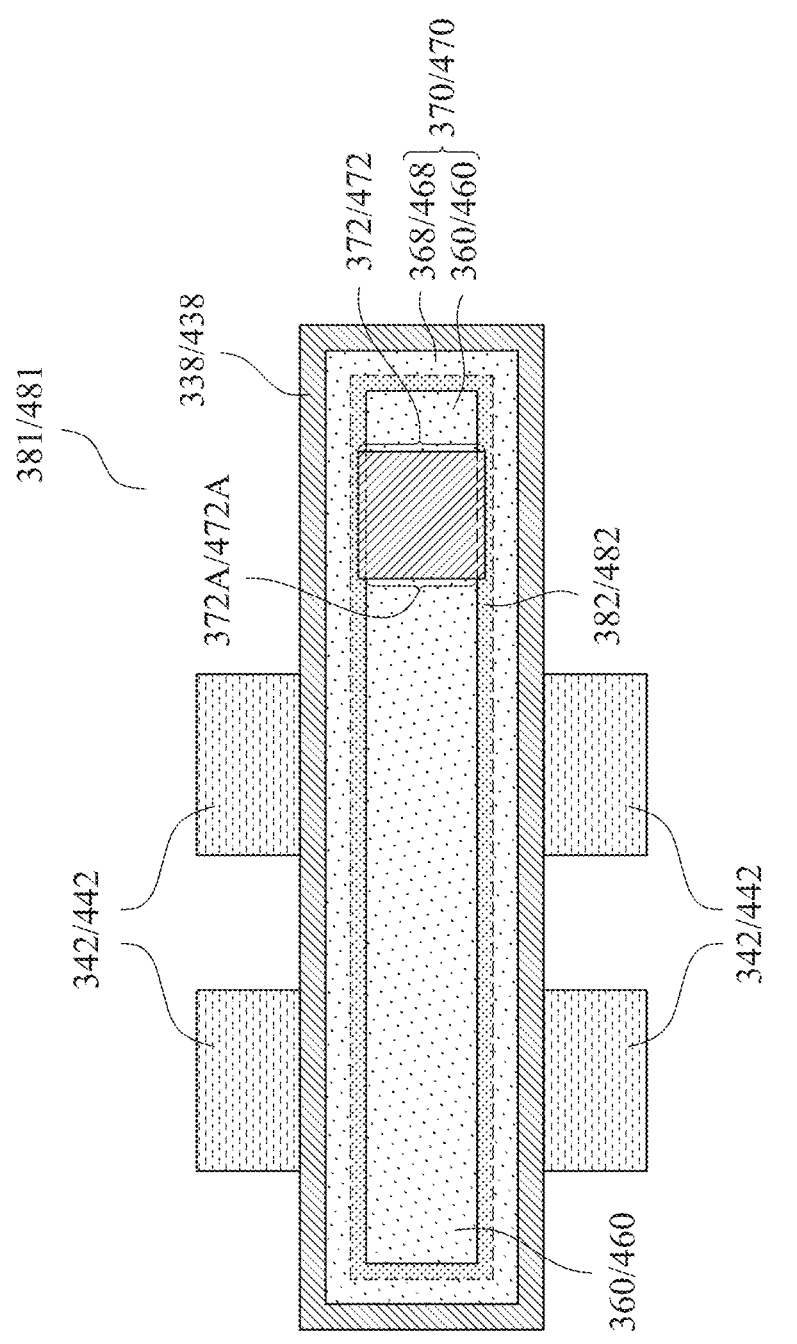

FIG. 27 illustrates a top view of FinFET 381 or 481 in accordance with some embodiments of the present disclosure. It is observed that hard mask portions 368/468 of hard masks 370 and 470 encircle the respective hard mask portions 360 and 460. Contact plug 372/472 extends into hard masks 370 and 470, with hard mask portions 360/460 having portions on opposite sides of contact plug 372/472. Furthermore, the edges of protruding portion 372A/472A and the corresponding edges of remaining hard mask portions 360/460 are aligned to straight lines.

FIGS. 18 through 25 illustrate the formation of short-channel FinFETs 181 and 281, mid-channel FinFET 381, and long-channel FinFET 481 in accordance with some embodiments of the present disclosure. Unless specified otherwise, the materials and the formation methods of the components in these embodiments are essentially the same as the like components, which are denoted by like reference numerals in the embodiments shown in FIGS. 1 through 17. The details regarding the formation process and the materials of the components shown in FIGS. 18 through 25 may thus be found in the discussion of the embodiment shown in FIGS. 1 through 17.

Figure 18:
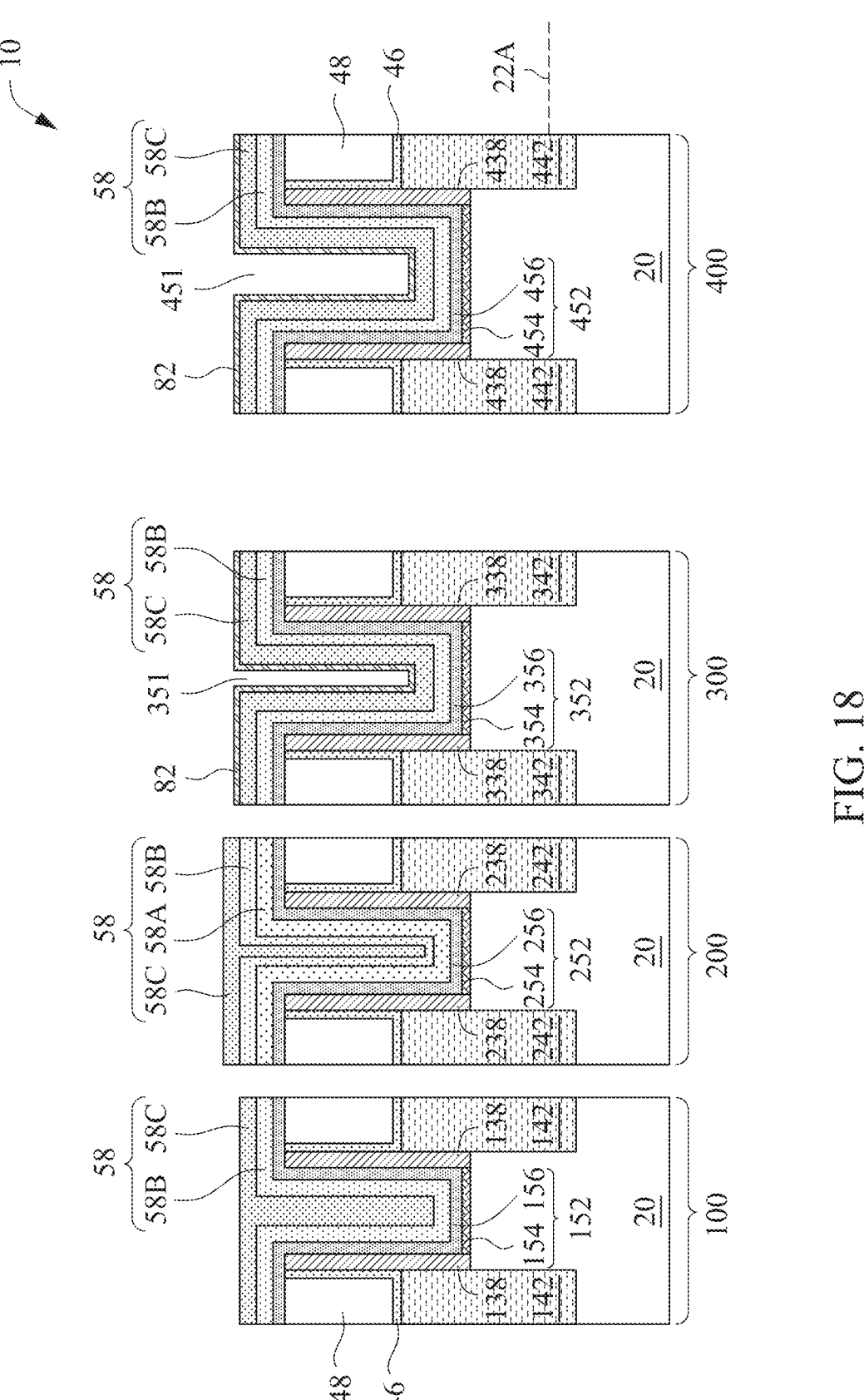
FIGS. 18 through 25 are perspective views and cross-sectional views of intermediate stages in the formation of FinFETs with different gate widths in accordance with some embodiments.

The initial steps of the formation process in accordance with some embodiments are essentially the same as shown in FIGS. 1 through 11. Next, as shown in FIG. 18, metal layer 82 is formed to extend into openings 351 and 451. Metal layer 82 is formed using a conformal deposition method, and may be formed using ALD, CVD, or the like.

Figure 19:
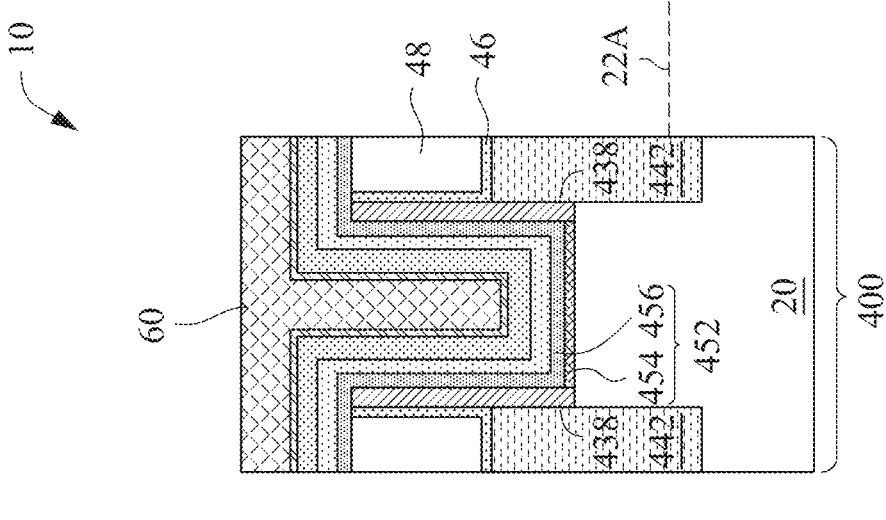
Figure 19:
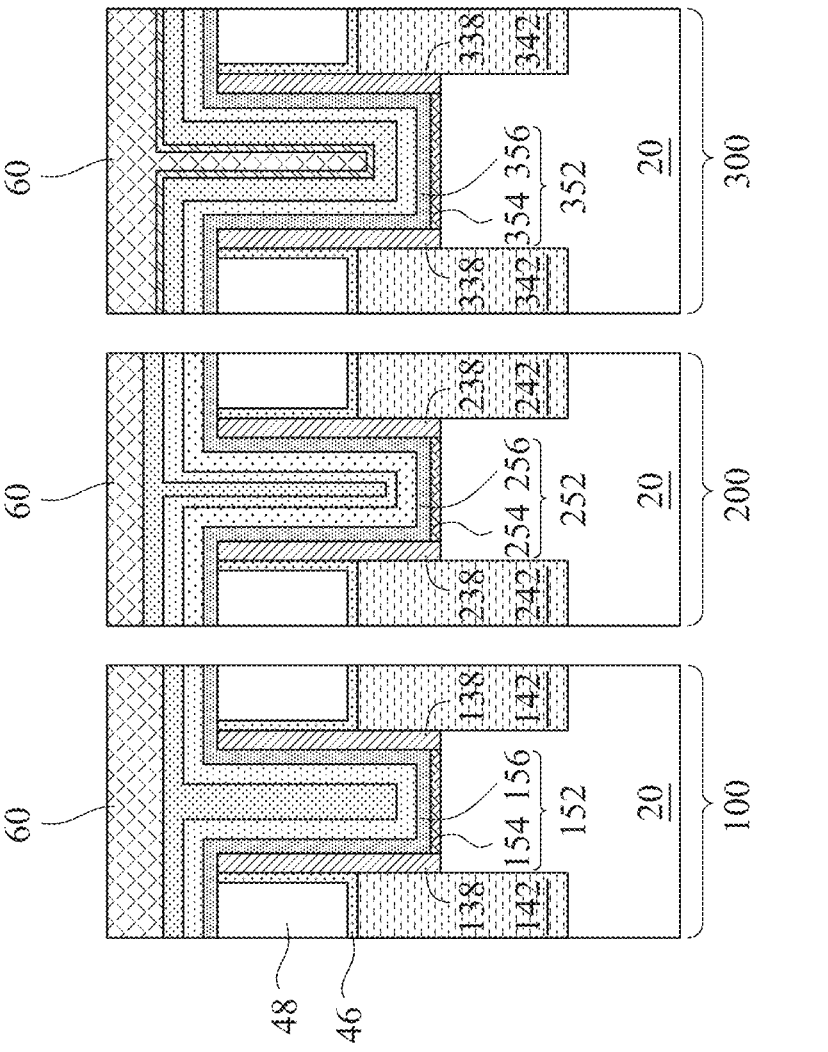

Metal layer 82 may be formed of tungsten, cobalt, or the like. The thickness of metal layer 82 may be smaller than about 10 nm, and may be smaller than about 5 nm in accordance with some embodiments of the present disclosure. FIG. 19 illustrates the formation of filling layer 60, which fills openings 351 and 451 (FIG. 18).

Figure 20:
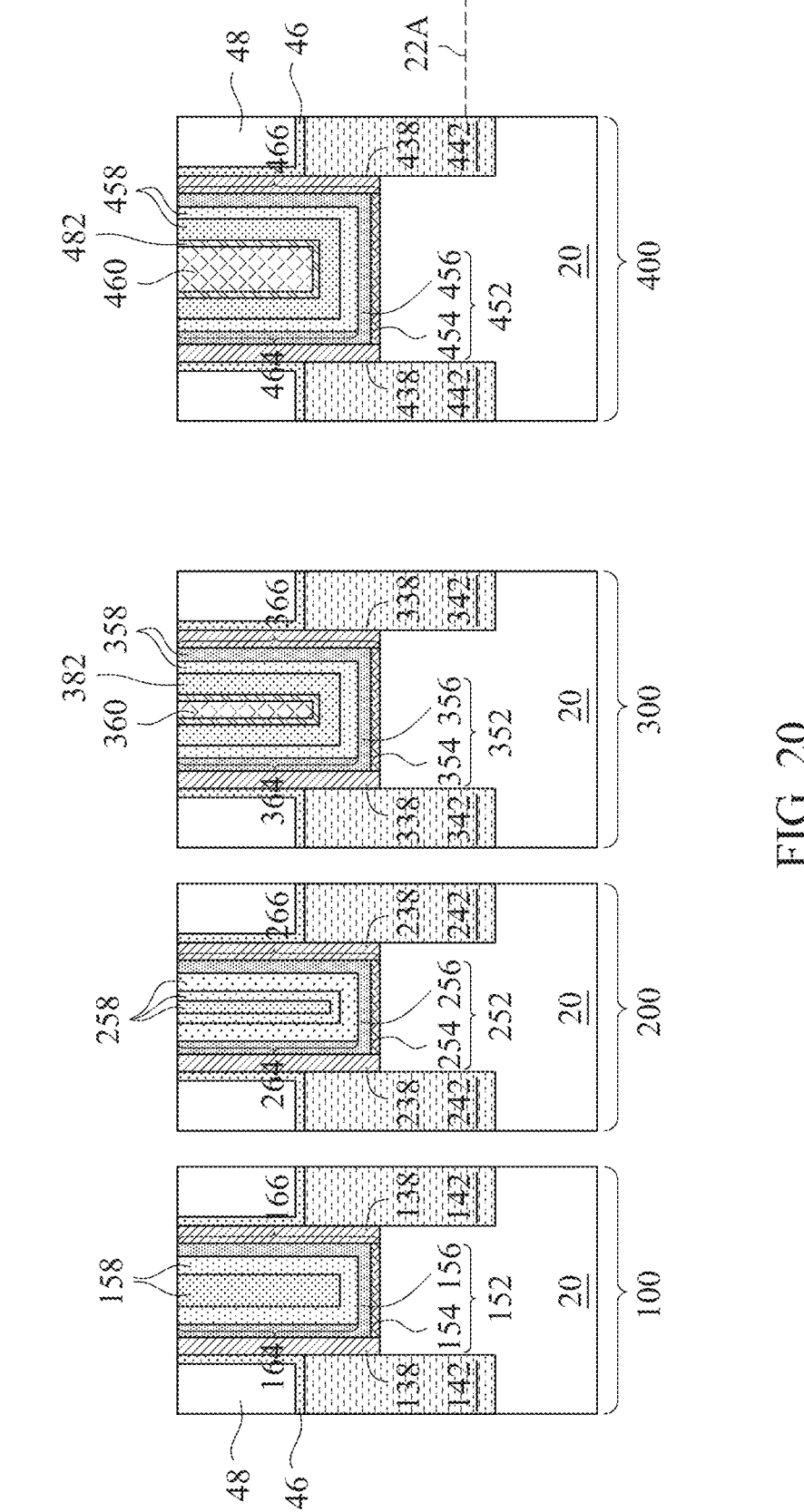

A planarization is then performed to remove the excess portions of materials over the top surfaces of ILD 48, as illustrated in FIG. 20. Replacement gate electrodes 164, 264, 364, and 464 are thus formed, which are parts of replacement gate stacks 166, 266, 366, and 466, respectively. Metal layer 82 has portions 382 and 482 remaining in device regions 300 and 400. Metal layer portions 382 and 482 form parts of gate electrodes 364 and 464.

Figure 21:
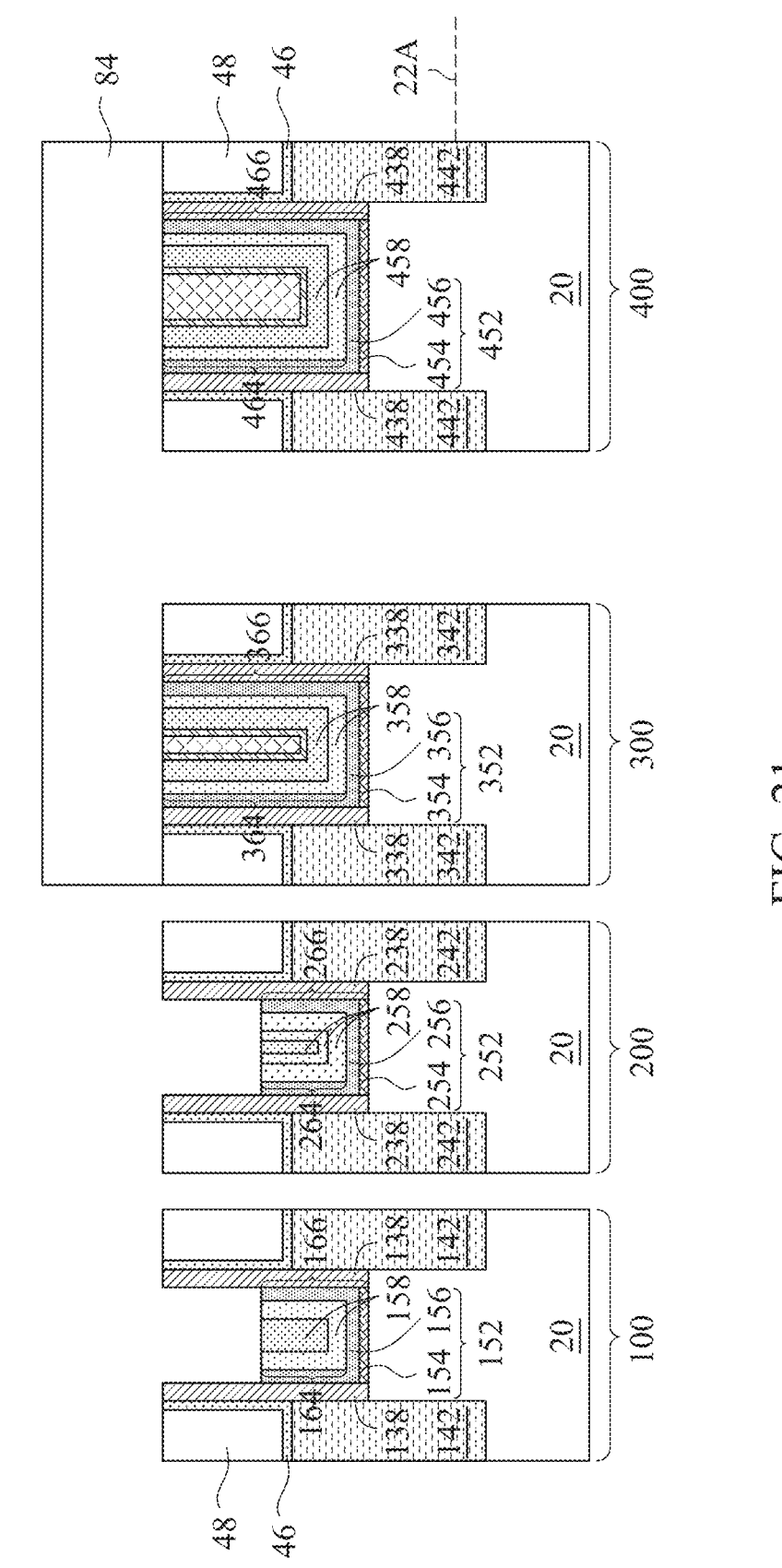
Figure 22:
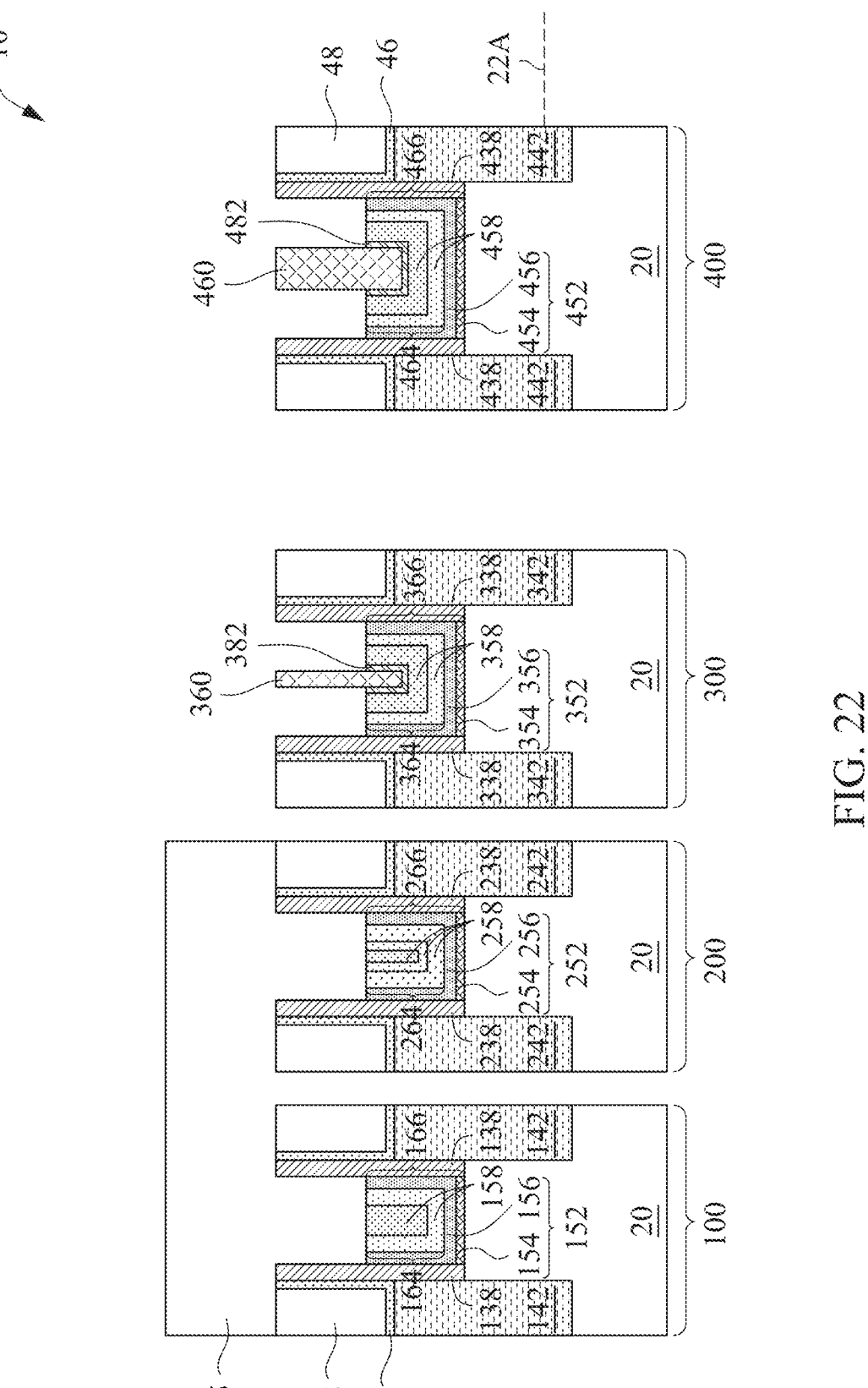

FIG. 21 illustrates the etch-back of gate stacks 166 and 266. In accordance with some embodiments of the present disclosure, a patterned photo resist 84 is formed in device regions 300 and 400, and the structures in device regions 100 and 200 are left un-protected. The etching gas may be similar to what are discussed referring to FIG. 14. After the etch-back of gate stacks 166 and 266, photo resist 85 is removed, and photo resist 85 is formed to cover device region 100 and 200, as shown in FIG. 22. Gate stacks 366 and 466 are then etched back. In accordance with some embodiments of the present disclosure, the etching gas includes the gas (such as $BCl_3$) for etching high-k dielectric layers, the gas (such as $Cl_2$) for etching metal layers 158, 258, 358, and 458, and the gas (such as $NF_3$) for etching metal layers 382 and 482. As a result, gate stacks 366 and 466 are recessed. It is appreciated that each of the top surfaces of metal layers 382 and 482 may be higher than, level with, or lower than, the top surfaces of the respective metal layers 358 and 458. Filling regions 360 and 460 are left without being removed.

Figure 23:
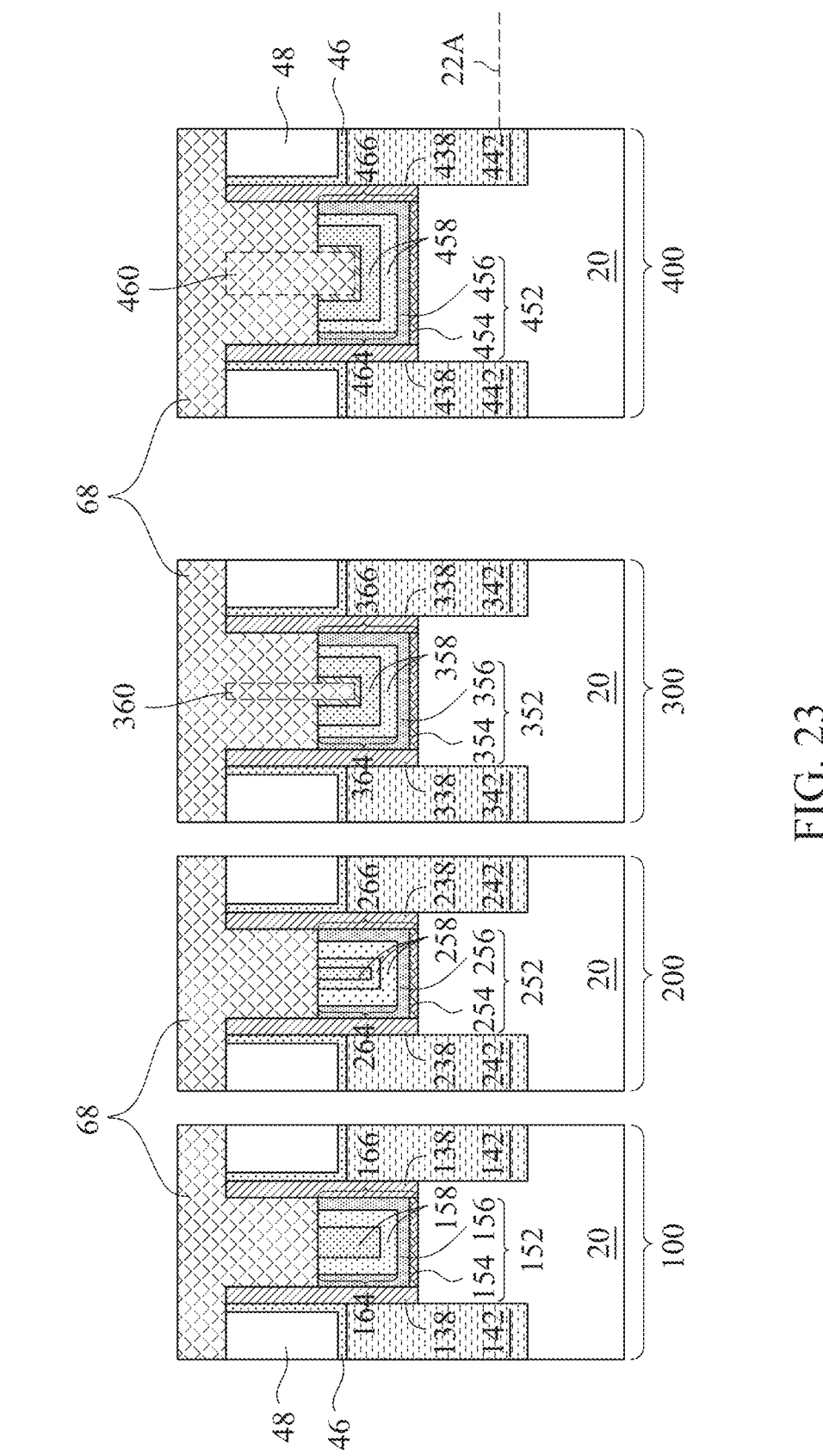

FIG. 23 illustrates the formation of dielectric material 68. The material of dielectric material 68 may be selected from the aforementioned, and may be the same as or different from that of filling regions 360 and 460. Also, filling regions 360 and 460 may be, or may not be, replaced with dielectric material 68.

Figure 24:
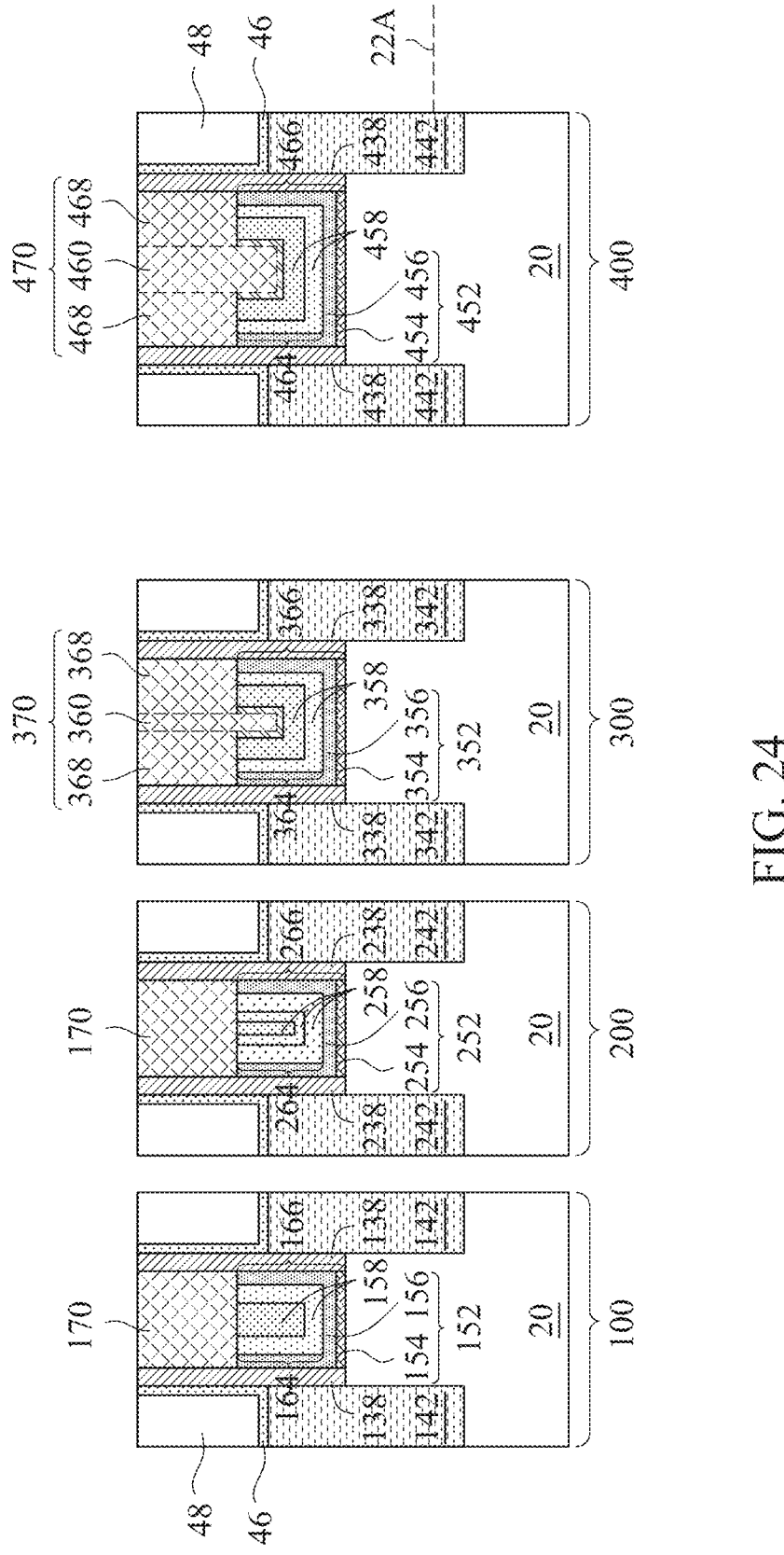

A planarization process is then performed to remove excess portions of dielectric material 68, as shown in FIG. 24, leaving hard masks 170, 270, 370, and 470. Hard mask 370 includes portions 360 and 368, which may be formed of the same or different materials. Hard mask 470 includes portions 460 and 468, which may be formed of the same or different materials. Regardless of whether portions 360 and 368 (and portions 460 and 468 also) are formed of the same material or different materials, there may be distinguishable interfaces therebetween when portions 360 and 368 (and portions 460 and 468) are not replaced.

Contact plugs 172, 272, 372, 472, 174, 274, 374, and 474 and silicide regions 176, 276, 376, and 476 are then formed, as shown in FIG. 25. Short-channel FinFETs 181 and 281, mid-channel FinFET 381, and long-channel FinFET 481 are thus formed. The cross-sectional view and the top view of the structure shown in FIG. 25 are illustrated in FIGS. 26 and 27, respectively, with metal layers 382 and 482 shown as being dashed to indicate they may or may not exist. FIG. 25 also illustrates the formation of the remaining features include ILD 78 and contact plugs 80.

As shown in FIG. 25, protruding portion 372A has depth D2' and width W2'. In accordance with some embodiments of the present disclosure, depth D2' is in the range between about 5 nm and about 15 nm. Width W2' is in the range between about 20 nm and about 30 nm. Aspect ratio D2'/W2' may be in the range between about 0.17 and about 0.75.

Protruding portion 472A has depth D3' and width W3'. In accordance with some embodiments of the present disclosure, depth D3' is in the range between about 5 nm and about 15 nm. Width W3' is in the range between about 230 nm and about 235 nm. Aspect ratio D3'/W3' may be in the range between about 0.02 and about 0.07. Aspect ratio D3'/W3' is smaller than aspect ratio D2'/W2'. Furthermore, ratio W3'/W2' is greater than 1.0, and may be greater than about 7.7. Ratio W3'/W2' may be in the range between about 7.7 and about 11.8 in accordance with some embodiments of the present disclosure.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The embodiments of the present disclosure have some advantageous features. By filling replacement gates with filling regions before the etch-back of metal gates, the widths of the portions of the replacement gates that are subject to etching are more uniform, regardless of the difference in the channel lengths of the FinFETs. Accordingly, the pattern-loading effect in the etch-back of the metal gates is reduced.

In accordance with some embodiments of the present disclosure, a method includes removing a dummy gate to leave a trench between gate spacers, forming a gate dielectric extending into the trench, depositing a metal layer over the gate dielectric, with the metal layer including a portion extending into the trench, depositing a filling region into the trench, with the metal layer have a first and a second vertical portion on opposite sides of the filling region, etching back the metal layer, with the filling region at least recessed less than the metal layer, and remaining parts of the portion of the metal layer forming a gate electrode, depositing a dielectric material into the trench, and performing a planarization to remove excess portions of the dielectric material. A portion of the dielectric material in the trench forms at least a portion of a dielectric hard mask over the gate electrode. In an embodiment, the method further includes removing a second dummy gate to leave a second trench between second gate spacers; and forming a first gate dielectric extending into the second trench, wherein the metal layer comprises a second portion fully filling the second trench. In an embodiment, the first vertical portion of the metal layer has a thickness substantially equal to a half of a width of the second portion of the metal layer in the second trench. In an embodiment, the filling region is formed of a non-dielectric material, and the method further comprises, removing the filling region before depositing the dielectric material into the first trench. In an embodiment, the filling region comprises amorphous silicon or polysilicon. In an embodiment, the dielectric material is deposited on the filling region. In an embodiment, the filling region is formed of an additional dielectric material. In an embodiment, after the etching back the metal layer, the gate electrode has a shape of a basin, and the basin comprises: a bottom portion; and sidewall portions encircling a bottom portion of the filling region. In an embodiment, the metal layer comprises a work-function layer. In an embodiment, the metal layer further comprises a non-work-function layer over the work-function layer.

In accordance with some embodiments of the present disclosure, a method includes forming a gate dielectric extending into a trench, wherein the trench is between opposite gate spacers; depositing a work-function layer over the gate dielectric; depositing a filling region on the work-function layer, wherein the filling region fully fills the trench; performing a planarization to remove excess portions of the work-function layer and the filling region to form a metal gate including the work-function layer; etching back the metal gate, wherein the filling region is substantially un-etched in the etching back; removing the filling region; and forming a dielectric hard mask in the trench and over the metal gate that is etched back. In an embodiment, the filling region comprises a dielectric material. In an embodiment, the filling region comprises polysilicon or amorphous silicon. In an embodiment, when the metal gate is etched back, a high-k gate dielectric portion of the gate dielectric is also etched. In an embodiment, the etching back the metal gate is performed using a chlorine-based etching gas. In an embodiment, the removing the filling region is performed using a fluorine-based etching gas.

In accordance with some embodiments of the present disclosure, a device includes a semiconductor region; gate spacers over the semiconductor region; a gate dielectric on the semiconductor region; a gate electrode over the gate dielectric and between the gate spacers, wherein the gate electrode comprises a metal layer forming a basin; a dielectric hard mask comprising a first portion over the gate electrode; and a gate contact plug extending into the dielectric hard mask, wherein the gate contact plug comprises; a first portion higher than top surfaces of the gate electrode; and a second portion extending into the gate electrode, wherein the gate electrode comprises a first vertical portion and a second vertical portion contacting opposite sidewalls of the second portion of the gate contact plug. In an embodiment, the dielectric hard mask comprises: a first dielectric material; and a second dielectric material on opposite sides of the first dielectric material, wherein the first dielectric material and the second dielectric material have a distinguishable interface, and wherein in a top view of the device, the first dielectric material and the second portion of the gate contact plug are aligned to a straight line. In an embodiment, the first dielectric material and the second dielectric material are different materials. In an embodiment, the dielectric hard mask further comprises a second portion extending into the basin, wherein the second portion of the dielectric hard mask comprises opposite sidewalls contacting the first vertical portion and the second vertical portion of the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first gate dielectric into a first trench between first gate spacers;

forming a second gate dielectric extending into a second trench between second gate spacers;

depositing a metal layer over the first gate dielectric, wherein the metal layer comprises:

a first portion extending into the first trench; and a second portion in the second trench;

depositing a filling region into the first trench, wherein in the first trench, the metal layer comprises a first vertical portion and a second vertical portion on opposite sides of the filling region, and wherein at a time before the filling region starts to be deposited into the first trench, an entirety of the second trench has been filled;

etching back the first vertical portion and the second vertical portion of the metal layer until first top surfaces of the first vertical portion and the second vertical portion are lower than a second top surface of the filling region;

removing an entirety of the filling region in the first trench; and depositing a dielectric material into the first trench.

2. The method of claim 1, wherein the dielectric material comprises:

a lower portion in the first trench and between remaining portions of the first vertical portion and the second vertical portion; and an upper portion in the first trench and higher than the remaining portions of the first vertical portion and the second vertical portion.

3. The method of claim 1, wherein the first vertical portion and the second vertical portion of the metal layer form portions of a gate electrode, and the method further comprises:

forming a gate contact plug at least partially in the first trench.

4. The method of claim 3, wherein a part of the gate contact plug is lower than top surfaces of the first vertical portion and the second vertical portion.

5. The method of claim 1, wherein the depositing the filling region comprises depositing an additional dielectric material.

6. The method of claim 1, wherein the depositing the metal layer comprises depositing a work-function layer.

7. The method of claim 6, wherein the depositing the metal layer further comprises depositing a filling-metal layer comprising tungsten or cobalt over the work-function layer.

8. The method of claim 1 further comprising, after the dielectric material is deposited into the first trench, performing a planarization process on the dielectric material.

9. The method of claim 1, wherein the first trench is lower than top surfaces of the first gate spacers.

10. The method of claim 1, wherein the depositing the filling region comprises depositing amorphous silicon or polysilicon.

11. The method of claim 10, wherein the depositing the filling region comprises depositing the amorphous silicon.

12. The method of claim 1, wherein in a cross-section of the first trench, the dielectric material is filled into a U-shaped basin formed of the metal layer.

13. A method comprising:

forming a gate dielectric extending into a trench, wherein the trench is between opposite gate spacers;

depositing a conductive layer over the gate dielectric;

depositing a filling region on the conductive layer;

performing a planarization process to remove excess portions of the filling region, the conductive layer, and the gate dielectric;

etching back the conductive layer, so that the filling region comprises a portion higher than remaining portions of the conductive layer;

etching the filling region to remove an entirety of the filling region;

after the filling region is etched, forming a dielectric hard mask in the trench;

performing an etching process to etch the dielectric hard mask and to form a contact opening; and forming a gate contact plug in the contact opening.

14. The method of claim 13, wherein the depositing the filling region comprises depositing a non-dielectric material.

15. The method of claim 14, wherein the depositing the filling region comprises depositing amorphous silicon or polysilicon.

16. The method of claim 13, wherein after the conductive layer is etched back, the conductive layer comprises a bottom portion under the filling region, and vertical portions on sidewalls of the filling region.

17. The method of claim 13, wherein when the conductive layer is etched back, the gate dielectric is simultaneously etched.

18. A method comprising:

forming an opening between gate spacers, wherein a semiconductor region is exposed through the opening;

forming a gate dielectric and a gate electrode in the opening;

forming a filling region filling the opening;

planarizing the filling region, the gate dielectric, and the gate electrode, so that top surfaces of the gate spacers are revealed;

etching the gate dielectric and the gate electrode;

after the gate dielectric and the gate electrode are etched, removing the filling region, wherein the removing the filling region results in a top surface and sidewalls of the gate electrode to be exposed;

forming a hard mask filling the opening and over the gate electrode, wherein the hard mask is filled into a space left by the filling region that is removed after the gate dielectric and the gate electrode are etched; and forming a gate contact plug in the hard mask, wherein the gate contact plug is electrically connected to the gate electrode, and wherein after the hard mask and the gate contact plug are formed, the gate contact plug is in contact with the top surface and the sidewalls of the gate electrode.

19. The method of claim 18, wherein the etching the gate dielectric and the gate electrode is performed using a chlorine-based etching gas.

20. The method of claim 18, wherein a portion of the gate contact plug is formed in the space left by the filling region that is removed after the gate dielectric and the gate electrode are etched.

*     *     *     *     *